US010982319B2

(12) United States Patent
Ruth et al.

(10) Patent No.: US 10,982,319 B2
(45) Date of Patent: Apr. 20, 2021

(54) HOMOGENEOUS LINEAR EVAPORATION SOURCE

(71) Applicant: FLISOM AG, Niederhasli (CH)

(72) Inventors: Marta Ruth, Pfaffhausen (CH); Reto Pfeiffer, Pfaffikon (CH)

(73) Assignee: FLISOM AG, Niederhasli (CH)

( * ) Notice: Subject to any disclaimer, the term of this patent is extended or adjusted under 35 U.S.C. 154(b) by 410 days.

(21) Appl. No.: 15/753,462

(22) PCT Filed: Aug. 19, 2016

(86) PCT No.: PCT/IB2016/001196
§ 371 (c)(1),
(2) Date: Feb. 19, 2018

(87) PCT Pub. No.: WO2017/033053
PCT Pub. Date: Mar. 2, 2017

(65) Prior Publication Data
US 2018/0245207 A1 Aug. 30, 2018

Related U.S. Application Data

(60) Provisional application No. 62/208,417, filed on Aug. 21, 2015, provisional application No. 62/371,545, filed on Aug. 5, 2016.

(51) Int. Cl.
C23C 14/24 (2006.01)
C23C 14/26 (2006.01)

(52) U.S. Cl.
CPC ............ C23C 14/243 (2013.01); C23C 14/26 (2013.01)

(58) Field of Classification Search
CPC .................. C23C 14/243; C23C 14/26
(Continued)

(56) References Cited

U.S. PATENT DOCUMENTS 3,971,334 A * 7/1976 Pundsack .............. C23C 14/243
118/665
5,037,624 A 8/1991 Tom et al.
(Continued)

FOREIGN PATENT DOCUMENTS

EP 1342808 A1 10/2003
EP 1927674 A2 6/2008
(Continued)

OTHER PUBLICATIONS

Taiwan Search Report (English Translation) for 105125186 dated Sep. 2, 2017, 1 page.
(Continued)

Primary Examiner — Elizabeth A Burkhart
(74) Attorney, Agent, or Firm — Patterson & Sheridan, LLP

(57) ABSTRACT

Embodiments of the present disclosure generally relate to evaporation sources used for physical vapor deposition of material onto substrates and more particularly for controlled coating of large substrates, such as vacuum deposition of copper, indium, gallium, selenium, tellurium, cadmium, or zinc on flexible substrates. Embodiments disclosed herein are able to control the evaporation rate of the source material during processing so as to obtain a uniform deposition across the width of the substrate as the complete length of a roll-to-roll substrate is moved past the evaporation source during processing.

20 Claims, 11 Drawing Sheets

(58) Field of Classification Search
USPC .................................................. 118/726, 727
See application file for complete search history.

(56) References Cited

U.S. PATENT DOCUMENTS

| | | | |
|---|---|---|---|
| 5,480,678 A | 1/1996 | Rudolph et al. | |
| 5,520,858 A | 5/1996 | Yamaguchi et al. | |
| 5,785,902 A | 7/1998 | Yamaguchi et al. | |
| 5,803,938 A | 9/1998 | Yamaguchi et al. | |
| 5,904,957 A | 5/1999 | Christin et al. | |
| 5,953,634 A | 9/1999 | Kajita et al. | |
| 6,056,820 A | 5/2000 | Balakrishna et al. | |
| 6,406,539 B1 | 6/2002 | Shigeto et al. | |
| 6,444,043 B1 | 9/2002 | Gegenwart et al. | |
| 6,669,988 B2 | 12/2003 | Daws et al. | |
| 6,911,234 B2 | 6/2005 | Warnes et al. | |
| 6,942,893 B2 | 9/2005 | Delperier et al. | |
| 6,953,605 B2 | 10/2005 | Sion et al. | |
| 7,060,134 B2 | 6/2006 | Chang | |
| 7,182,980 B2 | 2/2007 | Goujard et al. | |
| 7,339,139 B2 | 3/2008 | Yang et al. | |
| 7,487,956 B2 | 2/2009 | Gregg et al. | |
| 7,488,512 B2 | 2/2009 | Suzuki et al. | |
| 7,651,570 B2 | 1/2010 | Brcka | |
| 7,691,440 B2 | 4/2010 | Bernard et al. | |
| 7,691,443 B2 | 4/2010 | Rudolph et al. | |
| 7,828,274 B2 | 11/2010 | Gregg et al. | |
| 7,846,256 B2 | 12/2010 | Suzuki | |
| 7,959,973 B2 | 6/2011 | Waghray et al. | |
| 7,967,911 B2 | 6/2011 | Carlson et al. | |
| 8,057,855 B1 | 11/2011 | Rudolph et al. | |
| 8,128,073 B2 | 3/2012 | Gregg et al. | |
| 8,293,011 B2 | 10/2012 | Miyanaga et al. | |
| 8,313,804 B2 | 11/2012 | Carlson et al. | |
| 8,444,120 B2 | 5/2013 | Gregg et al. | |
| 8,821,640 B2 | 9/2014 | Cleary et al. | |
| 9,004,462 B2 | 4/2015 | Gregg et al. | |
| 9,469,898 B2 | 10/2016 | Gregg et al. | |
| 9,663,853 B2 | 5/2017 | Yanagi | |
| 9,702,058 B2 | 7/2017 | Shin et al. | |
| 9,828,670 B2 | 11/2017 | Goujard et al. | |
| 9,845,534 B2 | 12/2017 | Delperier et al. | |
| 9,863,034 B2 | 1/2018 | Yanagi | |
| 9,982,341 B2 | 5/2018 | Schoepp et al. | |
| 10,147,597 B1 | 12/2018 | Lee et al. | |
| 10,294,584 B2 | 5/2019 | Gupta et al. | |
| 10,385,452 B2 | 8/2019 | Hendrix et al. | |
| 10,392,700 B2 | 8/2019 | Baum et al. | |
| 10,465,282 B2 | 11/2019 | Rudolph | |
| 2002/0179013 A1* | 12/2002 | Kido | C23C 14/12 |
| | | | 118/718 |
| 2003/0035893 A1 | 2/2003 | Daws et al. | |
| 2003/0168013 A1* | 9/2003 | Freeman | C23C 14/243 |
| | | | 118/726 |
| 2004/0016404 A1 | 1/2004 | Gregg et al. | |
| 2004/0237898 A1 | 12/2004 | Bernard et al. | |
| 2005/0000427 A1 | 1/2005 | Lee et al. | |
| 2005/0034671 A1 | 2/2005 | Ohara | |
| 2005/0147753 A1 | 7/2005 | Smith | |
| 2006/0037540 A1 | 2/2006 | Woelk et al. | |
| 2006/0185597 A1 | 8/2006 | Suzuki et al. | |
| 2006/0263525 A1 | 11/2006 | Sion et al. | |
| 2007/0119849 A1* | 5/2007 | Jeong | C23C 14/26 |
| | | | 219/546 |
| 2007/0266949 A1 | 11/2007 | Shenai-Khatkhate | |
| 2008/0092816 A1 | 4/2008 | Birtcher et al. | |
| 2008/0191153 A1 | 8/2008 | Marganski et al. | |
| 2009/0107401 A1 | 4/2009 | Reinhold et al. | |
| 2009/0181168 A1 | 7/2009 | Chaubey et al. | |
| 2010/0139564 A1 | 6/2010 | Lee et al. | |
| 2010/0255198 A1 | 10/2010 | Cleary et al. | |
| 2011/0000430 A1 | 1/2011 | Yanagi | |
| 2011/0005462 A1 | 1/2011 | Yanagi | |
| 2011/0076399 A1 | 3/2011 | Shim et al. | |
| 2013/0061969 A1 | 3/2013 | Koike | |
| 2013/0340680 A1 | 12/2013 | Sonoda et al. | |
| 2014/0182515 A1 | 7/2014 | Yamazaki et al. | |
| 2014/0329025 A1 | 11/2014 | Cleary et al. | |
| 2015/0191819 A1 | 7/2015 | Hendrix et al. | |
| 2015/0218691 A1 | 8/2015 | Yanagi | |
| 2017/0037511 A1 | 2/2017 | Cleary et al. | |
| 2017/0233864 A1 | 8/2017 | Park et al. | |
| 2017/0283948 A1 | 10/2017 | Chiu et al. | |
| 2017/0342557 A1 | 11/2017 | Baum et al. | |
| 2018/0274093 A1 | 9/2018 | Takagi et al. | |
| 2019/0032206 A1 | 1/2019 | Hodges et al. | |

FOREIGN PATENT DOCUMENTS

| | | |
|---|---|---|
| JP | 2012-0207238 A | 10/2012 |
| JP | 2015-010257 A | 1/2015 |
| TW | 200712230 A | 4/2007 |
| TW | 201102449 A | 1/2011 |
| TW | 201339336 A | 10/2013 |

OTHER PUBLICATIONS

PCT International Search Report and Written Opinion dated Feb. 10, 2017 for PCT/IB2016/001196, filed Aug. 19, 2016.

PCT International Search Report and Written Opinion dated Feb. 7, 2017, for PCT/IB2016/001142, filed Aug. 17, 2016.

* cited by examiner

HOMOGENEOUS LINEAR EVAPORATION SOURCE

CROSS-REFERENCE TO RELATED APPLICATIONS

This application is a national stage application under 35 U.S.C. 371 of PCT/IB2016/001196, filed Aug. 19, 2016, which claims priority to U.S. Application No. Ser. No. 62/208,417, filed on Aug. 21, 2015 and U.S. Application Ser. No. 62/371,545, filed Aug. 5, 2016, all of which are incorporated herein by reference in their entirety.

BACKGROUND

Field

Embodiments of the present disclosure generally relate to evaporation sources used for physical vapor deposition of material onto substrates, and more particularly to an apparatus and method of depositing a material using a physical vapor deposition process on large substrates in a vacuum environment.

Description of the Related Art

A roll-to-roll deposition process is commonly used to form CIGS (copper-indium-gallium-(di)selenide) solar cell devices. During processing, a flexible substrate is generally unwound from a roll and moved past a series of evaporation sources to deposit the different precursor elements used to form the CIGS absorber layer of the solar cell. Each evaporation source includes a crucible to heat and vaporize source material that deposits onto the flexible substrate as the substrate moves past the evaporation source. Uniform deposition of the different elements is necessary to produce a high-quality CIGS solar cell. It can be challenging to control the evaporation rate of the source material during processing, which makes it difficult to obtain a uniform deposition across the width of the substrate (e.g., the direction perpendicular to which the substrate is moving) as the substrate is moved past the evaporation source during processing. The evaporation rate of the source material is not easily measured, so it can be difficult to control the evaporation rate, especially when faced with changing conditions, such as thermal disturbances from other evaporation sources and a varying fill level of source material in the crucible during processing. It is also desirable during production to maintain a constant evaporation rate over a long duration such as several days, preferably one week. Therefore, there is a need for an evaporation source that can improve the deposition uniformity of source material.

SUMMARY

Embodiments of the present disclosure generally relate to evaporation sources used for physical vapor deposition of material onto substrates, and more particularly to an apparatus and method of depositing a material using a physical vapor deposition process on large substrates in a vacuum environment.

In one embodiment, an evaporation source for depositing a source material on a substrate is provided. The evaporation source includes a crucible including a base; a plurality of walls surrounding an interior region of the crucible, the plurality of walls including a first end wall spaced apart from a second end wall in a first direction. The evaporation source further includes a lid disposed over the interior region, the lid including a first outer section including a first plurality of openings, a second outer section including a second plurality of openings, and an inner section including a third plurality of openings, where the first outer section is spaced apart from the second outer section in the first direction. The inner section is disposed between the first outer section and the second outer section. The openings in the third plurality of openings are spaced farther apart from each other than the openings in the first plurality of openings are from each other.

In another embodiment, an evaporation source for depositing a source material on a substrate is provided. The evaporation source includes a crucible including a base, a plurality of walls surrounding an interior region of the crucible, the plurality of walls including a first end wall spaced apart from a second end wall in a first direction. The interior region includes a first outer region, a second outer region and a central region. The central region is disposed between the first outer region and the second outer region. Each of the first outer region, the second outer region, and the central region has a same width in the first direction. The evaporation source further includes a first heater disposed in the base, the first heater configured to provide heat at a higher rate to the first outer region than to the central region.

In another embodiment, a method of depositing a source material on a substrate is provided. The method includes placing deposition material in an interior region of a crucible. The crucible includes a base and a plurality of walls surrounding the interior region of the crucible. The plurality of walls include a first end wall spaced apart from a second end wall in a first direction. The interior region includes a first outer region, a second outer region, and a central region. The central region is disposed between the first outer region and the second outer region. Each of the first outer region, the second outer region, and the central region has a same width in the first direction. The method further includes heating the deposition material by providing more heat to the first outer region than to the central region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments. However, it should be understood that the disclosure is not limited to specific described embodiments. Instead, any combination of the following features and elements, whether related to different embodiments or not, is contemplated to implement and practice the claimed subject matter. Furthermore, although embodiments described herein may achieve advantages over other possible solutions and/or over the prior art, whether or not a particular advantage is achieved by a given embodiment is not limiting of the claimed subject matter. Thus, the following aspects, features, embodiments and advantages are merely illustrative and are not considered elements or limitations of the appended claims except where explicitly recited in a claim(s).

Embodiments of the present disclosure generally relate to evaporation sources used for physical vapor deposition of material onto substrates and more particularly for controlled coating of large substrates, such as vacuum deposition of copper, indium, gallium, selenium, tellurium, cadmium, or zinc on flexible substrates. Said evaporation sources may, for example, be used within vacuum chambers where a plurality of evaporation source types, some of which may have physical and design characteristics different from the evaporation source 100 described below, are configured to implement a co-evaporation process.

Figure 1A:
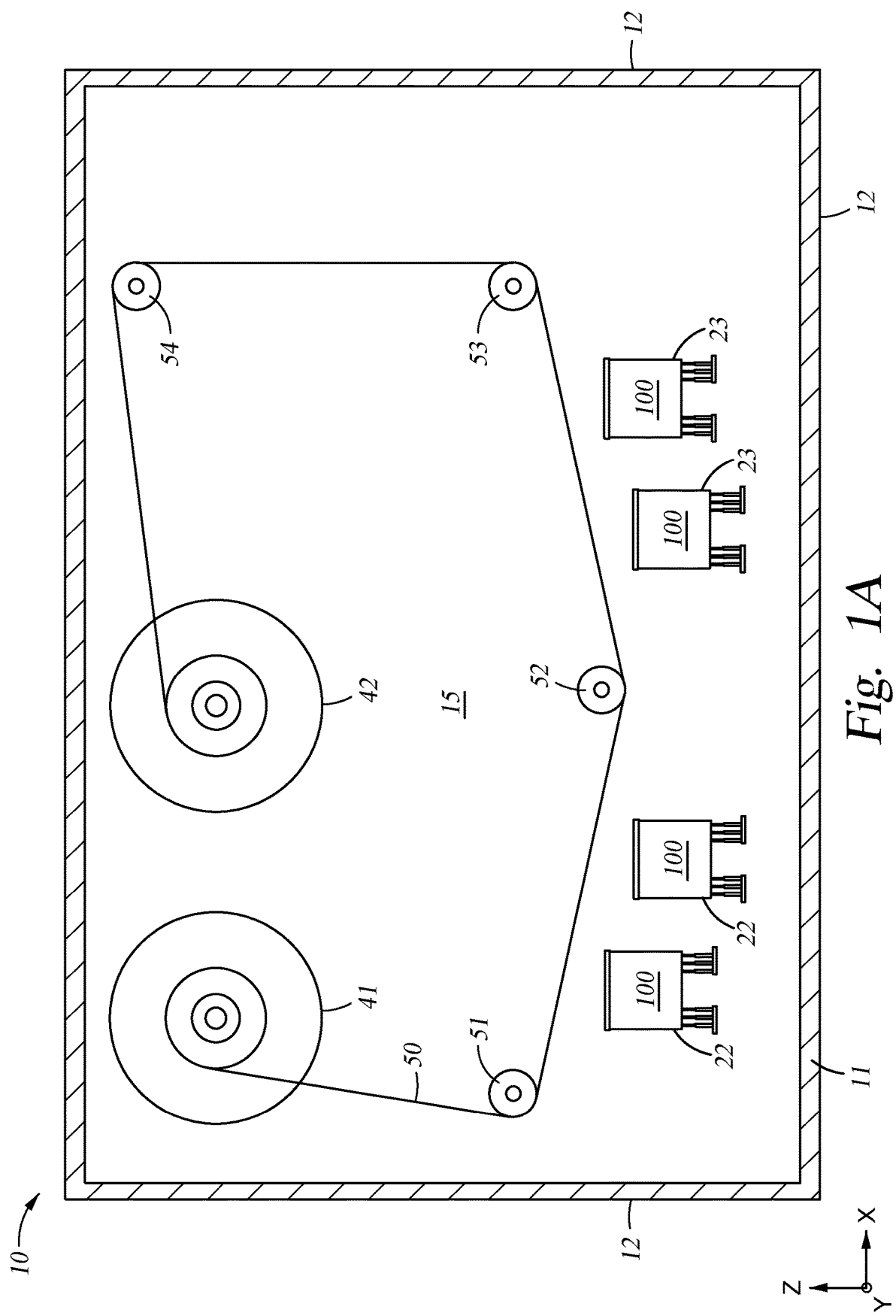
FIG. 1A is a side cross-sectional view of a vapor deposition system, according to one embodiment.

FIG. 1A is a side cross-sectional view of a vapor deposition system 10, according to one embodiment. While not intending to limit the scope of the disclosure provided herein, in one embodiment, the vapor deposition system 10 is a roll-to-roll type vapor deposition system for depositing material layers onto a flexible substrate 50. The vapor deposition system 10 includes a vacuum chamber 11 including one or more walls 12 for enclosing a processing region 15 of the vapor deposition system 10. The vapor deposition system 10 can further include one or more evaporation sources 100, which are disposed within the processing region 15.

Typically, the processing region 15 of the vacuum chamber 11 is maintained at a constant vacuum pressure. The vapor deposition system 10 includes one or more sets 22, 23 of two or more evaporation sources 100 that are positioned within the processing region 15 to deposit material layer(s) onto the substrate 50 as the substrate 50 is transferred through the processing region 15. In some embodiments, the substrate 50 can include a web of flexible polyimide or flexible stainless steel material. The substrate 50 can be transferred through the processing region 15 from a feed roll 41, over tensioning rolls 51, 52, 53, 54 and to a take-up roll 42.

The evaporation sources 100 can each contain material that can be heated to a molten state, so that the heated material evaporates to coat portions of the substrate 50 as the substrate 50 passes near each evaporation source 100. The sets 22 and 23 of evaporation sources 100 may be oriented so as to follow the path of the substrate 50 through the processing region 15.

A person of ordinary skill in the art will recognize that any appropriate material may be deposited on a substrate using the vapor deposition system 10. The vapor deposition system 10 is particularly appropriate for deposition of materials to create photovoltaic cells, particularly CIGS (copper-indium-gallium-(di)selenide) solar cells or CdTe (cadmium-tellurium) solar cells. In one example, at least one GIGS-containing semiconductive photovoltaic layer, also known as the absorber layer, is deposited onto a portion of the substrate 50. The semiconductive photovoltaic layer may, for example, be made of an "ABC" material, wherein "A" represents elements in group 11 of the periodic table of chemical elements (e.g., copper (Cu) or silver (Ag)), "B" represents elements in group 13 of the periodic table (e.g., indium (In), gallium (Ga), or aluminum (Al)), and "C" represents elements in group 16 of the periodic table (e.g., sulfur (S), selenium (Se), or tellurium (Te)). An example of an $ABC_2$ material is the $Cu(In,Ga)Se_2$ semiconductor also known as a CIGS material. Other thin-film absorber materials include cadmium telluride (CdTe) and its variants, perovskites, amorphous silicon, thin-film silicon, as well as absorber materials used to manufacture dye-sensitized solar cells or organic solar cells.

Figure 1B:
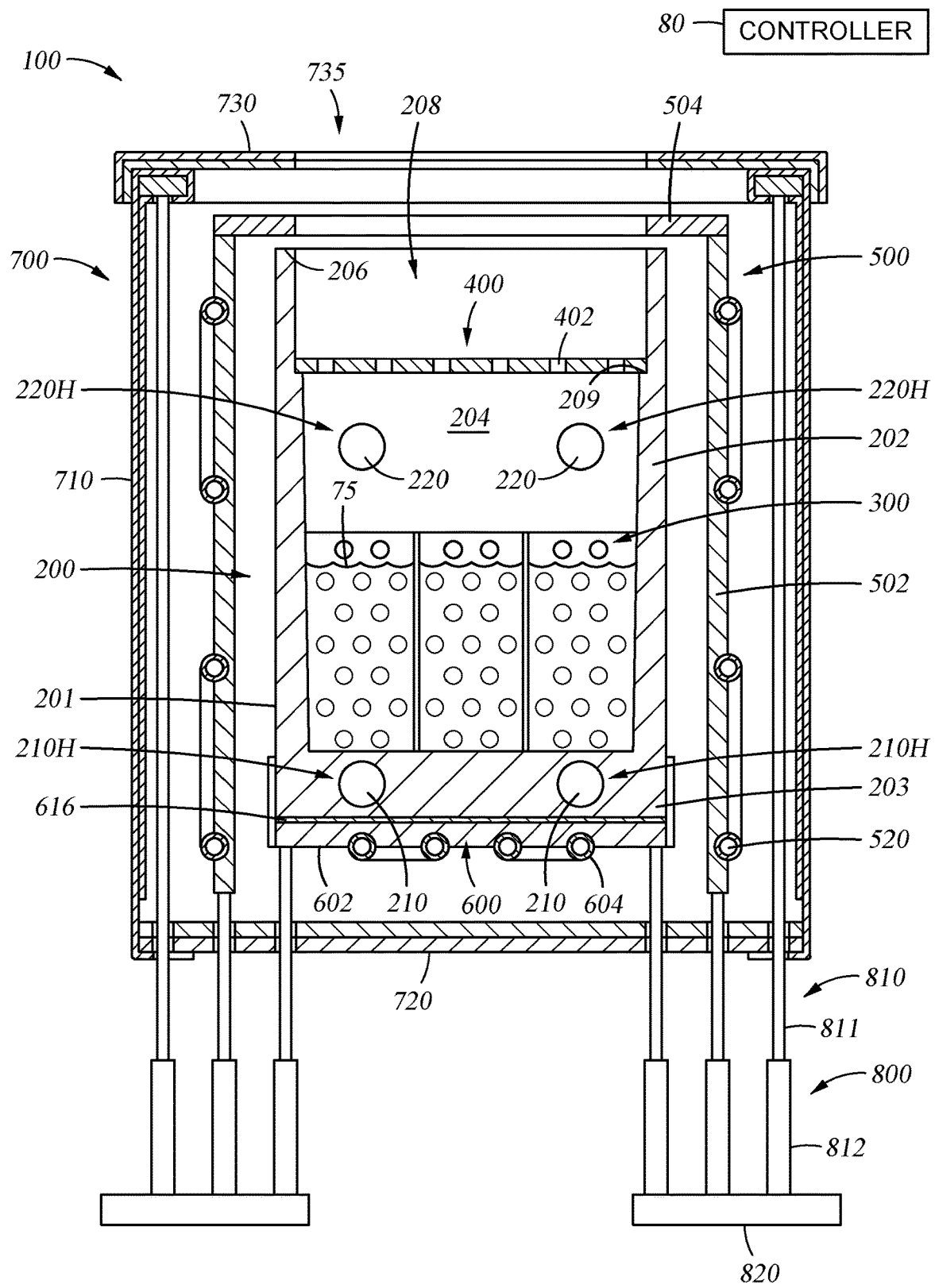
FIG. 1B is a side cross-sectional view of an evaporation source, according to one embodiment.

FIG. 1B is a side cross-sectional view of one of the evaporation sources 100, according to one embodiment. The evaporation source 100 includes a crucible assembly 200 that includes a crucible 201 and a first heater 210H. The first heater 210H includes a heating cable 210. The crucible 201 can be formed of a material having high-thermal conductivity, such as molybdenum, graphite or stainless steel. The crucible 201 includes one or more walls 202, a base 203, and a top 206. The one or more walls 202 surround the interior region 204 of the crucible 201. The crucible 201 further includes an opening 208 above the interior region 204 of the crucible 201 and surrounded by the top 206 of the crucible 201. Deposition material 75 (e.g., a precursor element such as copper, indium, gallium, or selenium) can be placed in an interior region 204 of the crucible 201 and heated, so that vapor of the deposition material 75 can be directed through the opening 208 of the crucible 201 to deposit on the substrate 50 (see FIG. 1A).

The first heater 210H provides heat to melt and evaporate the deposition material 75 (e.g., copper, indium, gallium, or selenium) in the interior region 204 of the crucible 201 during processing. In some embodiments, the first heater 210H can be disposed within the base 203 of the crucible 201 to provide heat from below the deposition material 75. In some embodiments, the first heater 210H can include a heating cable 210; such as a sheathed heating cable, powered by electrical connections (not shown). Further details of the first heater 210H are described below in reference to FIGS. 1C and 1D.

In some embodiments, the evaporation source 100 can further include a thermal distributor 300 disposed within the interior region 204 of the crucible 201. However, in some embodiments the thermal distributor 300 may be omitted. The thermal distributor 300 can be used to uniformly distribute heat to the deposition material 75 during processing. The thermal distributor 300 can be fabricated from a material that is heat-resistant, chemically compatible with the deposition material 75 and has a high thermal conductivity, such as refractory metals, such as molybdenum. The thermal distributor 300 can be sized in relation to interior region 204 of the crucible 201 to ensure good thermal contact between the thermal distributor 300 and the one or more walls 202 of the crucible 201.

The evaporation source 100 can further include a second heater 220H. The first heater 220H includes a corresponding heating cable 220. Although the evaporation source 100 is shown including two heaters 210H, 220H, in some embodiments only one heater may be included. The second heater 220H can be disposed in the interior region 204 of the crucible 201 above the thermal distributor 300. In some embodiments, the deposition material 75 can be maintained at levels below the top of the thermal distributor 300, which keeps the second heater 220H in a position that contacts vapor of deposition material 75, but the not the liquid deposition material 75. The second heater 220H can be used to provide heat to the deposition material 75 and to control the evaporation rate of the deposition material 75. In some embodiments, the second heater 220H can include a heating cable 220, such as a sheathed heating cable, powered by electrical connections (not shown).

In some embodiments, the first heater 210H can be used to control the temperature of the liquid deposition material 75 and the second heater 220H can be used to control the temperature of the vapor of the deposition material 75. For example, a first temperature control loop (e.g., PID loop) can be executed by a controller 80, where a first temperature sensor (not shown) configured to sense the temperature of deposition material 75 is the input to the first temperature control loop and the power provided to the first heater 210H is the output of the first temperature control loop. Similarly, a second temperature control loop (e.g., PID loop) can be executed by the controller 80, where a second temperature sensor (not shown) configured to sense the temperature of the vapor of the deposition material 75 is the input to the second temperature control loop and the power provided to the second heater 220H is the output of the second temperature control loop. In other embodiments, both heaters 210H, 220H can be used to control the temperature of the deposition material 75. Further details of the second heater 220H are described below in reference to FIGS. 1D and 1E. However, in some embodiments the first heater 210H and/or the second heater 220H may be omitted.

The evaporation source 100 further includes a lid assembly 400 disposed above the thermal distributor 300. The lid assembly 400 can be positioned on a supporting ridge 209 of the crucible 201. The lid assembly 400 thermally isolates the interior region 204 of the crucible 201 from the areas above the crucible 201. The lid assembly 400 may be formed from a heat resistant and thermally conductive material, such as molybdenum or graphite. The lid assembly 400 includes openings 402 to direct evaporated deposition material towards the substrate 50 (see FIG. 1A) during processing. In one configuration, the openings 402 are sized to control the effusion of material from the evaporation source 100. In one example, the diameters of the openings 402 are from about 1 millimeter (mm) to about 40 mm, such as from about 2 mm to about 20 mm in size, and are spaced apart from each other by a distance from about 5 mm to about 400 mm, such as from about 10 mm to about 200 mm. Furthermore, in some embodiments, one or more of the openings 402 can have a shape of a slot having a length from about 20 mm to about 80 mm, such as about 40 mm.

The evaporation source 100 further includes a thermal isolation assembly 500 disposed around the crucible 201. The thermal isolation assembly 500 includes one or more vertical walls 502 and a top plate 504. The one or more vertical walls 502 can surround the one or more walls 202 of the crucible 201. The top plate 504 can be disposed over the top 206 of the crucible 201. The thermal isolation assembly 500 isolates the walls and top of the crucible 201 from variations in thermal loads coming from outside of the thermal isolation assembly 500, such as heat coming from one of the other evaporation sources 100 in the vacuum chamber 11. For example, without the thermal isolation assembly 500, the crucible assembly 200 would receive heat from other sources in the vacuum chamber 11, such as other evaporation sources 100. In some embodiments, the one or more of the walls 502 can be formed of a material having high thermal conductivity, such as copper. The thermal isolation assembly 500 can further include one or more cooling tubes 520. The cooling tubes 520 can be disposed around and/or adjacent to the one or more walls 502. Cooling fluid may be distributed through the cooling tube(s) 520 to prevent external sources of heat from causing thermal disturbances within the interior region 204 of the crucible 201.

In some embodiments, the evaporation source 100 can further include a cooling assembly 600. However, in some embodiments, the cooling assembly 600 may be omitted. The cooling assembly 600 includes a cooling plate 602 disposed below the crucible 201. The cooling plate 602 can be used too rapidly cool the deposition material 75 when processing is completed or stopped. The cooling assembly 600 may further include one or more cooling tubes 604. In some embodiments, a sheet 616 material having a high thermal conductivity, such as graphite, may be disposed between the cooling plate 602 and the crucible 201 to further promote thermal contact between the cooling plate 601 and the crucible 201. The sheet 616 may also help provide some temperature regulation, control of the crucible 201 temperature and reduced stress in the cooling plate 601 and crucible 201 due to a difference in temperature between the cooling plate 601 and the crucible 201 during processing.

The evaporation source 100 further includes a heat shield assembly 700 disposed around the thermal isolation assembly 500 and the cooling assembly 600 to further prevent external heat loads from causing thermal disturbances within the interior region 204 of the crucible 201. The heat shield assembly 700 includes one or more side wall portions 710, one or more base portions 720, and a lid portion 730. The one or more materials used for the side wall portions 710 can be chosen to be chemically compatible with the material evaporated by the evaporation source 100, and such materials can include stainless steel and molybdenum as these materials pose a low risk of contaminating the evaporation process. The one or more base portions 720 can be disposed below the cooling assembly 600. The lid portion 730 can be disposed above the top plate 504 of the thermal isolation assembly 500. The lid portion 730 may be supported by the one or more side wall portions 710. Each portion 710, 720, 730 can be formed of a highly reflective and heat-resistant material, such as molybdenum. In some embodiments, each portion 710, 720, 730 can include two or more sheets of the highly reflective, heat-resistant material, such as molybdenum.

The evaporation source 100 further includes a leg assembly 800. The leg assembly 800 provides support for other assemblies within the evaporation source 100, such as the thermal isolation assembly 500, the cooling assembly 600, and the heat shield assembly 700. Adjustment and positioning of the leg assembly 800 also determines where the evaporation source 100 is positioned within the vacuum chamber 11 (FIG. 1A). In some embodiments, the feet 820 of the leg assembly 800 are positioned on a portion of the wall 12 of the vapor deposition system 10. In one configuration, the leg assembly 800 includes a plurality of legs 810 and a plurality of feet 820 that are used to level and vertically position the evaporation source 100 relative to the substrate 50 and thermally isolate the evaporation source 100 from portions of the vapor deposition system 10.

Figure 1C:
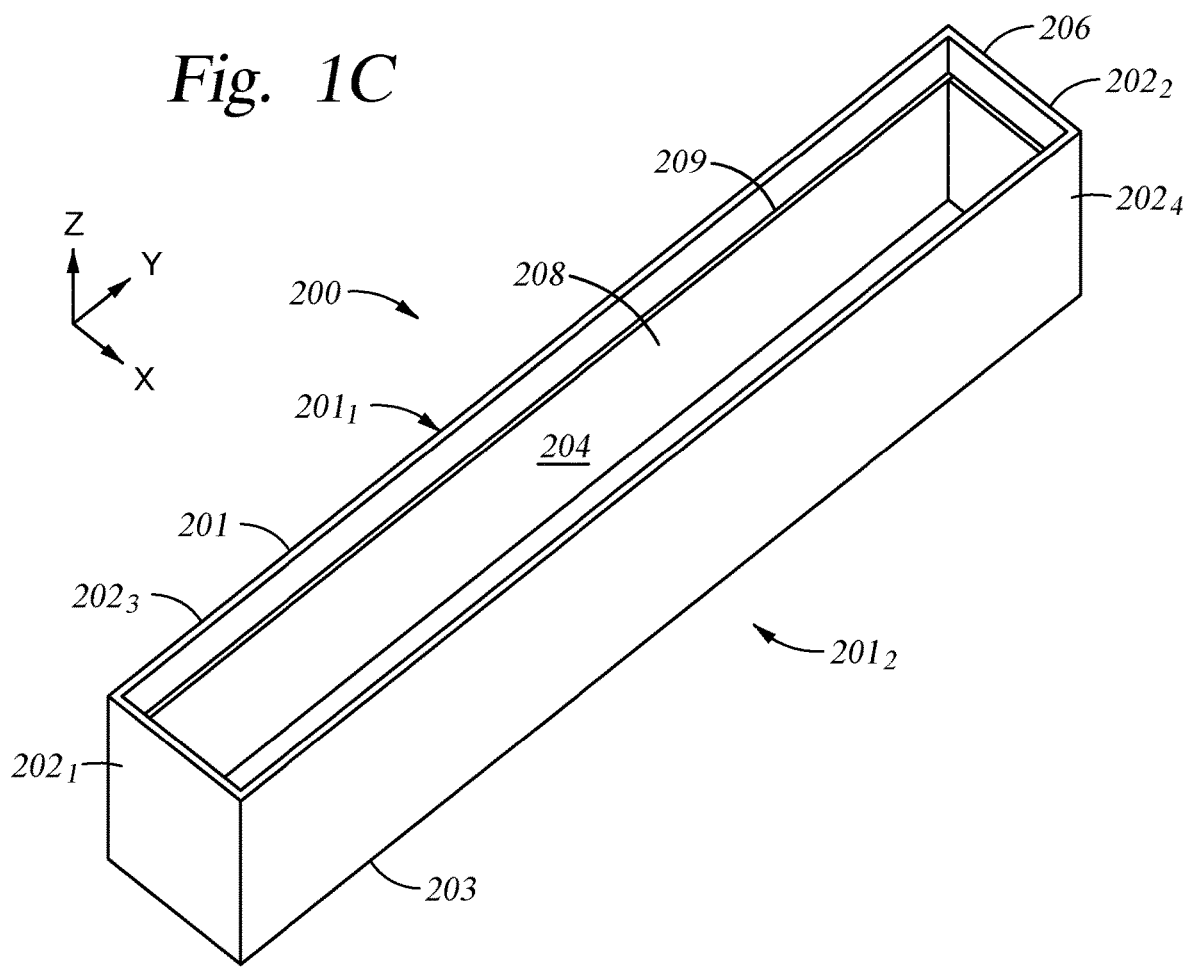
FIG. 1C is a perspective view of the crucible assembly, according to one embodiment.

FIG. 1C is a perspective view of the crucible assembly 200, according to one embodiment. In some embodiments, the crucible 201 can have a shape substantially similar to a rectangular prism having an open top. An evaporation source 100 having a crucible with a substantially rectangular shape, such as the crucible 201, is referred to herein as a linear evaporation source. The substrate 50 (FIG. 1A) can be moved linearly above the linear evaporation source including the crucible 201 in the X-direction.

In embodiments including a linear evaporation source such as the crucible 201, the walls 202 can include a first end wall $202_1$, a second end wall $202_2$ opposite to the first end wall $202_1$, a first side wall $202_3$, and a second side wall $202_4$ opposite to the first side wall $202_3$. The first side wall $202_3$ connects the first end wall $202_1$ to the second end wall $202_2$ along a first side $201_1$ of the crucible 201. The second side wall $202_4$ connects the first end wall $202_1$ to the second end wall $202_2$ along a second side $201_2$ of the crucible 201. The side walls $202_3$, $202_4$ each have a horizontal length (Y-direction in FIG. 2A) extending in a direction from the first end wall $202_1$ to the second end wall $202_2$. The end walls $202_1$, $202_2$ each have a horizontal length (X-direction in FIG. 1C) extending in a direction from the first side wall $202_3$ to the second side wall $202_4$.

The side walls $202_3$, $202_4$ generally have a horizontal length that is longer than the length of the end walls $202_1$, $202_2$. The substrate 50 (FIG. 1A) moves above the crucible 201 in the X-direction and the width of the substrate 50 in the Y-direction can be disposed over most of opening 208 of the crucible 201 in the Y-direction, such as 60% or more of the opening 208 in the Y-direction. In some embodiments, a ratio of the length of the side walls $202_3$, $202_4$ in the Y-direction to the length of the end walls $202_1$, $202_2$ in the X-direction can be from about 5:1 to about 500:1. In some embodiments, the length of the side walls $202_3$, $202_4$ in the Y-direction is related to the width of the substrate 50 in the Y-direction. For example, the length of the side walls $202_3$, $202_4$ in the Y-direction may be longer than the width of the substrate 50 in the Y-direction by about 20 mm to about 400 mm, such as by about 200 mm. In some embodiments, the length of the side walls $202_3$, $202_4$ in the Y-direction may be longer than the width of the substrate 50 in the Y-direction by a first distance (FD) that is related to the distance (i.e., second distance (SD)) between the opening 208 of the crucible 201 to the substrate 50 in the Z-direction. In one example, the first distance (FD) has a magnitude that is between the second distance divided by five (SD/5) and about five times the second distance (5×SD).

Figure 1E:
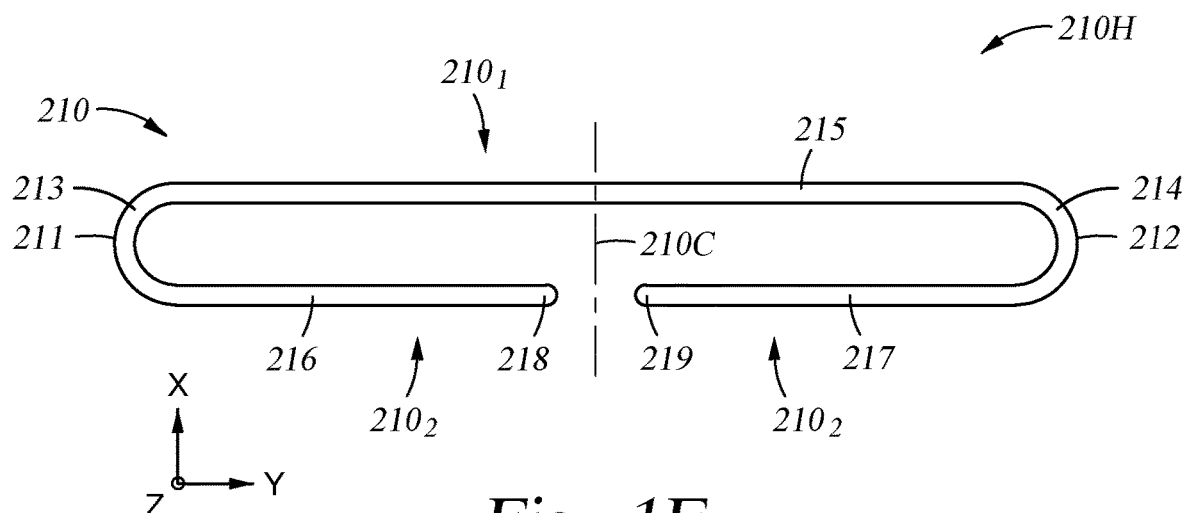
FIG. 1E is a top view of the first heater, according to one embodiment.
Figure 1D:
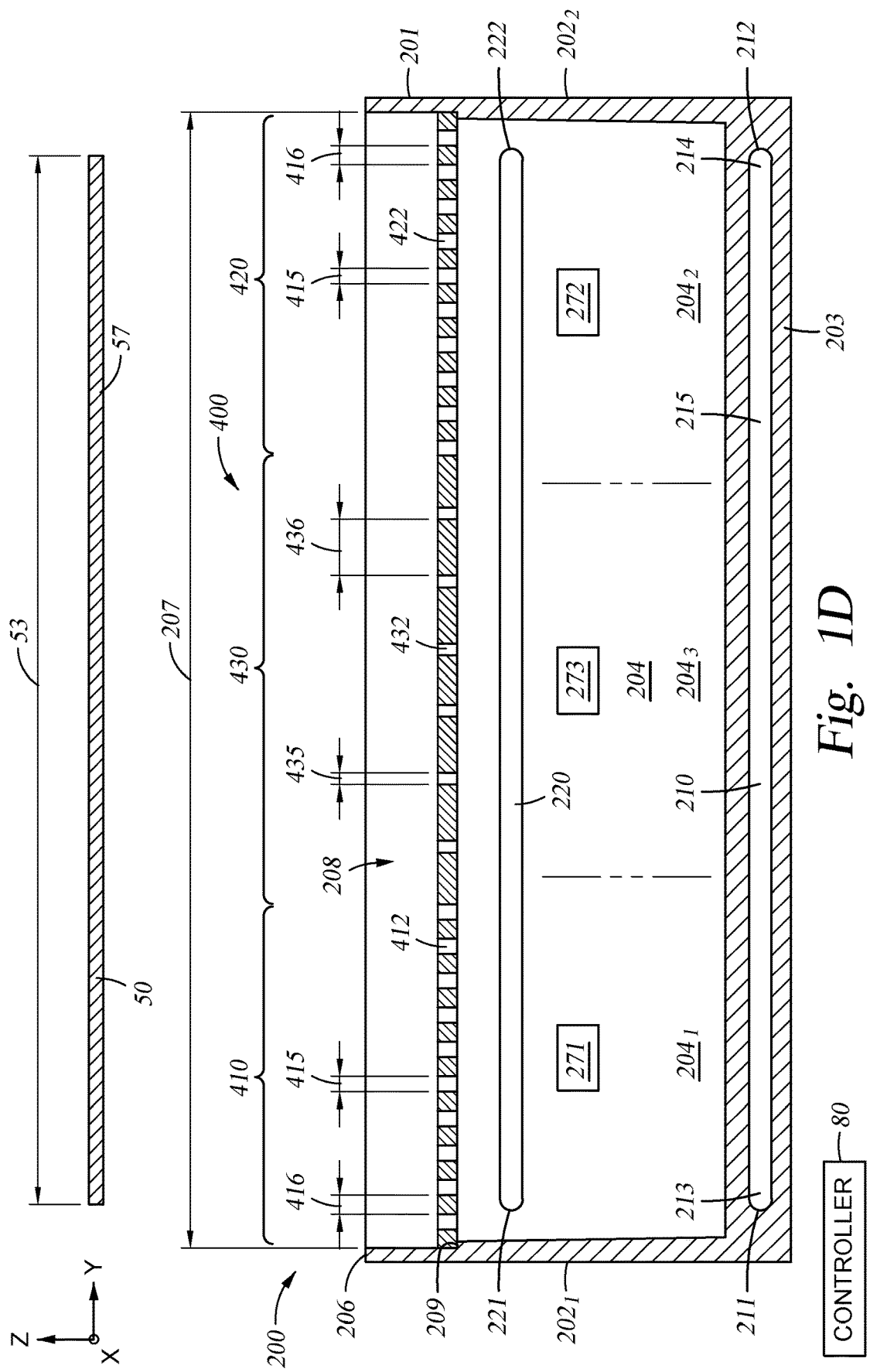
FIG. 1D is a side cross-sectional view of a crucible, a first heater, a second heater, a lid assembly, and a substrate, according to one embodiment.

FIG. 1D is a side cross-sectional view of the crucible 201, the first heater 210H, the second heater 220H, the lid assembly 400, and the substrate 50, according to one embodiment. The view in FIG. 1D shows a cross-section of the Y-Z plane, which is perpendicular to the movement of the substrate 50 in the X-direction as shown in FIG. 1A.

The opening 208 of the crucible 201 has a width 207 (FIG. 1D) in the Y-direction that is greater than a width 55 of the substrate 50. Vapor from the deposition material 75 (FIG. 1A) can be directed towards a lower surface 57 of the substrate 50 through all or substantially all of the width 207 of the opening 208 of the crucible 201. Having the width 207 of the opening 208 be wider than the width 55 of the substrate 50 can help to ensure the lower surface 57 of the substrate 50 is fully and homogeneously coated by the vapor of the deposition material 75. The heating cable 210 of the first heater 210H can extend in the Y-direction from a first end 211 to a second end 212 for a length that is substantially as long as the width 207 of the opening 208, such as a length that is at least 75% of the width 207, such as a length that is at least 90% of the width 207. The heating cable 220 of the second heater 220H can extend in the Y-direction from a first end 221 to a second end 222 for a length that is substantially as long as the width 207 of the opening 208, such as a length that is at least 75% of the width 207, such as a length that is at least 90% of the width 207.

The lid assembly 400 can include a first outer section 410, a second outer section 420, and an inner section 430. The first outer section 410 can be disposed on the supporting ridge 209 of the crucible 201 at or proximate to the first end wall $202_1$. The second outer section 420 can be disposed on the supporting ridge 209 of the crucible 201 at or proximate to the second end wall $202_2$. The inner section 430 can be disposed between the first outer section 410 and the second outer section 420. The inner section 430 can be substantially centered in the crucible 201 in the Y-direction.

Although the openings of the lid assembly 400 are collectively referred to as openings 402 (FIG. 1B), the lid assembly 400 can include different groups of openings. The first outer section 410 can include a first plurality of openings 412 that are spaced apart from each other in the Y-direction by a first distance 416. The second outer section 420 can include a second plurality of openings 422 that are also spaced apart from each other in the Y-direction by the first distance 416. The inner section 430 can include a third plurality of openings 432 that are spaced apart from each other in the Y-direction by a second distance 436. The second distance 436 can be greater than the first distance 416, which can allow for a greater concentration of openings in the outer sections 410, 420 than in the inner section 430. The greater concentration of openings in the outer sections 410, 420 can help to increase the flux of vapor of the deposition material 75 (FIG. 1B) towards the substrate 50 through the openings in the outer sections 410, 420 relative to outer sections (not shown) that include the same concentration of openings as the inner section 430. The increased heat loss can slow the flux of vapor of deposition material 75 at outer sections that include the same concentration of openings as the inner section 430. Thus, the increased flux of vapor through the outer sections 410, 420 having a greater concentration of openings 412, 422 than the openings 432 in the inner section 430 can help reduce the variability of the deposition rate on the lower surface 57 of the substrate 50 in the Y-direction.

Furthermore, in some embodiments the openings in the first plurality of openings 412 and the second plurality of openings 422 in the outer sections 410, 420 can have a width 415 (e.g., a diameter) in the Y-direction that is greater than a width 435 (e.g., a diameter) in the Y-direction of the third plurality of openings 432 in the inner section 430. The increased width 415 of the openings 412, 422 relative to the width 435 of the openings 432 is another way to increase the flux of vapor of the deposition material 75 towards the substrate 50 through the openings in the outer sections 410, 420, which serves as a another way of reducing the variability of the deposition rate on the lower surface 57 of the substrate 50 in the Y-direction.

In other embodiments, the lid assembly 400 can include a plurality of openings that are spaced apart from each other in the Y-direction by distances that vary, such as increase or decrease (e.g., between each pair of openings), based on how far the openings are from a center of the lid assembly in the Y-direction. For example, the openings that are closest to the center of the lid assembly in the Y-direction could be spaced apart from each other by the greatest distance, and the openings that are closest to either one of the crucible walls, such as the first end wall $202_1$ could be spaced apart from each other by the shortest distance. Similarly, in some embodiments the width of the openings could increase for each opening based on how far the openings are from a center of the lid assembly in the Y-direction. For example, the openings located closest to the center of the lid assembly in the Y-direction could have the narrowest width in the Y-direction, and the openings located closest to either one of the crucible end walls $202_1$, $202_2$, could have the widest width in the Y-direction. By increasing the spacing between each pair of the openings or by increasing the width of the openings for each opening as distance is increased from the center of the lid assembly in the Y-direction in a more continuous manner, the variability of the deposition rate on the lower surface 57 of the substrate 50 in the Y-direction can be further reduced.

The interior 204 of the crucible 201 can include a first outer region $204_1$, a second outer region $204_2$, and a central region $204_3$. The central region $204_3$ can be disposed between the first outer region $204_1$ and the second outer region $204_2$. Each region $204_1$, $204_2$, $204_3$ can extend for a same distance in the Y-direction. Each region $204_1$, $204_2$, $204_3$ can include a respective temperature sensor 271, 272, 273 (FIG. 1D) to measure the temperature in the respective region $204_1$, $204_2$, $204_3$. In some embodiments, each temperature sensor 271, 272, 273 can be placed at a height in the Z-direction so that the temperature sensor is always within the molten deposition material 75 (see FIG. 1B). In other embodiments one or more of the temperature sensors 271, 272, 273 can be placed at a height in the Z-direction to measure a temperature of the vapor of the deposition material 75 (e.g., within region 204 (FIG. 1B)).

FIG. 1E is a top view of the first heater 210H (e.g., looking-Z-direction), according to one embodiment. Although FIG. 1E is described in reference to the first heater 210H, the second heater 220H can have a similar shape and have similarities to other features of the first heater 210H described in FIG. 1E.

As described above, the heating cable 210 of the first heater 210H extends from the first end 211 to the second end 212 in the Y-direction. The first heater 210H includes a first curved portion 213 located at the first end 211. The first heater 210H includes a second curved portion 214 located at the second end 212. The first heater 210H has a first side $210_1$ spaced apart from a second side $210_2$ in the X-direction. The heating cable 210 includes a first segment 215 extending along the first side $210_1$ of the first heater 210H and connecting the first curved portion 213 to the second curved portion 214. The view of the first heater 210H in FIG. 1D is a side view of the first segment 215 extending from the first curved portion 213 to the second curved portion 214. Furthermore, the similar view of the second heater 220H in FIG. 1D can be a side view of a corresponding first segment extending between corresponding curved portions on the second heater 220H.

The heating cable 210 further includes a first inner segment 216 extending along the second side $210_2$ of the first heater 210H from the first curved portion 213 towards a center 210C of the first heater 210H in the Y-direction. The heating cable 210 further includes a second inner segment 217 extending along the second side $210_2$ from the second curved portion 214 towards the center 210C of the first heater in the Y-direction. The heating cable 210 can further include a first inner end 218 and a second inner end 219 spaced apart from each other in the Y-direction. The first inner segment 216 can be connected to the first inner end 218. The second inner segment 217 can be connected to the second inner end 219. Electrical current can flow through the heating cable 210 of the first heater 210H from the first inner end 218, through the first inner segment 216, through the first curved portion 213, through the first segment 215, through the second curved portion 214, through the second inner segment 217, and to the second inner end 219. The overall shape of the first heater 210H can be an open loop with the spacing between the first inner end 218 and the second inner end 219 representing the opening in the loop. Electrical connections (not shown) can be made to the first inner end 218 and the second inner end 219 to provide power to the first, heater 210H.

Figure 1F:
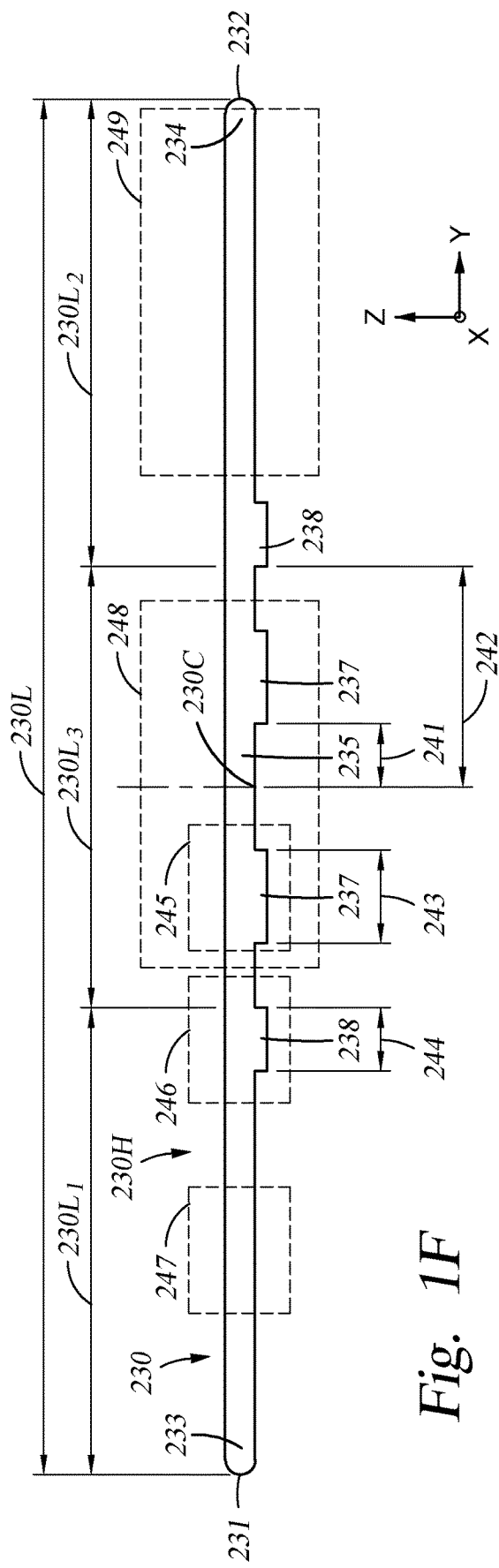
FIG. 1F is a side view of a heater, according to another embodiment.

FIG. 1F is a side view of a heater 230H, according to one embodiment. The heater 230H can be used, for example, in place of the first heater 210H (see FIG. 1D) in some embodiments and is referred to in the following description as the first heater 230H. The top view (not shown) of the first heater 230H can be the same as the top view of the first heater 210H shown in FIG. 1E. The view of the first heater 230H shown in FIG. 1F can correspond to the side view shown in FIG. 1D of the first heater 210H. The first heater 230H can include a heating cable 230 including a first segment 235 extending from a first curved portion 233 located at a first end 231 of the heating cable 230 to a second curved portion 234 located at a second end 232 of the heating cable 230. Because the top view (not shown) of the first heater 230H can be the same as the top view of the first heater 210H shown in FIG. 1E, the first heater 230H can also include portions (not shown) corresponding to the first inner segment 216 and the second inner segment 217 shown in FIG. 1E.

The first heater 230H is similar to the first heater 210H described above except that the first heater 230H includes one or more portions having a varying power output per unit length. In one configuration, the first heater 230H is similar to the first heater 210H described above except that the first heater 230H includes one or more portions having an increased thickness, so that the amount of heat emitted by the first heater 230H (e.g., power=$I^2R$=$V^2/R$) can vary in the Y-direction (i.e., the direction that corresponds to the width 55 of the substrate disposed above the crucible 201 as shown in FIG. 1D) as a current is delivered through, and/or voltage is applied across, the length of the first heater 230H. Although the increased thickness can be in more than one direction or all directions (e.g., a rounded cable having an increased thickness), the increased thickness is shown here for the first heater 230H in the Z-direction. The first heater 230H has a center 230C in the Y-direction. The heating cable 230 of the first heater 230H can include two first portions 237 having an increased thickness relative to the remainder of the first segment 235 that is not part of a portion having an increased thickness, such as the portion of first segment 235 shown in region 247. Each first portion 237 having an increased thickness can be spaced apart from the center 230C in the Y-direction by a first distance 241, wherein the first portions 237 are disposed on opposing sides of the center 230C from each other in the Y-direction. Each first portion 237 has an increased thickness that can extend for a first length 243 in the Y-direction.

The heating cable 230 of the first heater 230H can further include two second portions 238 having an increased thickness relative to the remainder of the first segment 235 that is not part of a portion having an increased thickness, such as the portion of first segment 235 shown in region 247. Each second portion 238 having an increased thickness can be spaced apart from the center 230C in the Y-direction by a second distance 242, wherein the second portions 238 are disposed on opposing sides of the center 230C from each other in the Y-direction. Each second portion 238 has an increased thickness that extends for a second length 244 in the Y-direction.

The portions 237, 238 having increased thickness are used to alter the amount of heat emitted along the lengths 243, 244 of the portions 237, 238 relative to corresponding lengths in the first segment 235 not having an increased thickness, such as the portion of first segment 235 shown in region 247. The increased thickness of the portions 237, 238 lowers the electrical impedance of the portions 237, 238 across the respective lengths 243, 244 relative to the electrical impedance of corresponding lengths of the first segment 235 not having an increased thickness. Thus, the portions 237, 238 emit less heat than portions of the first segment 235 having the same length in the Y-direction but not having an increased thickness.

The first distance 241 is less than the second distance 242, so the first portions 237 are located closer to the center 230C than the second portions 238 are to the center 230C. Furthermore, the first length 243 is longer than the second length 244, so the first portions 237 extend for a longer length in the Y-direction than the second portions 238 extend in the Y-direction. The locations of the first portions 237, which are closer to the center 230C, and the longer lengths of the first portions 237 relative to the second portions 238, causes the first heater 230H to emit less heat to regions that are closer to the center 230C than to similarly sized regions that are further from the center 230C. Furthermore, the first heater 230H emits more heat to regions not including a portion having an increased thickness. For example, for three regions of the same size including a first region 245 surrounding one of the first portions 237, a second region 246 surrounding one of the second portions 238, and a third region 247 surrounding a portion of the first segment 235 not having an increased cross-sectional area, the least amount of heat is emitted to the first region 245, the most amount of heat is emitted to the third region 247, and the heat emitted to the second region 246 is greater than the first region 245 but less than the third region 247.

Thus, in some embodiments, the amount of heat provided by the first heater 230H generally increases in the Y-direction as the heating cable 230 extends away from the center 230C. Referring to FIG. 1D, by providing more heat from portions of the first heater 230H that are further away from the center 230C, more heat can be provided to the outer regions $204_1$, $204_2$ of the interior region 204 of the crucible 201, such as regions of the interior region 204 of the crucible 201 near or bordering the first end wall $202_1$ and the second end wall $202_2$. By providing more heat to the outer regions of the interior region 204 of the crucible 201, the variability in the evaporation rate of the deposition material 75 (see FIG. 1B) in the Y-direction can be reduced. For example, if a constant rate of heat is provided in the Y-direction, then the evaporation rate of the deposition material 75 (see FIG. 1B) can be lower at the outer regions of the interior region 204 of the crucible 201 due to the increased heat losses around these outer regions. Thus, by providing additional heat to these outer regions using the first heater 230H accounts for the additional heat loss at the outer regions, and the variability in the evaporation rate of the deposition material 75 (see FIG. 1B) in the Y-direction can be reduced.

Figure 1G:
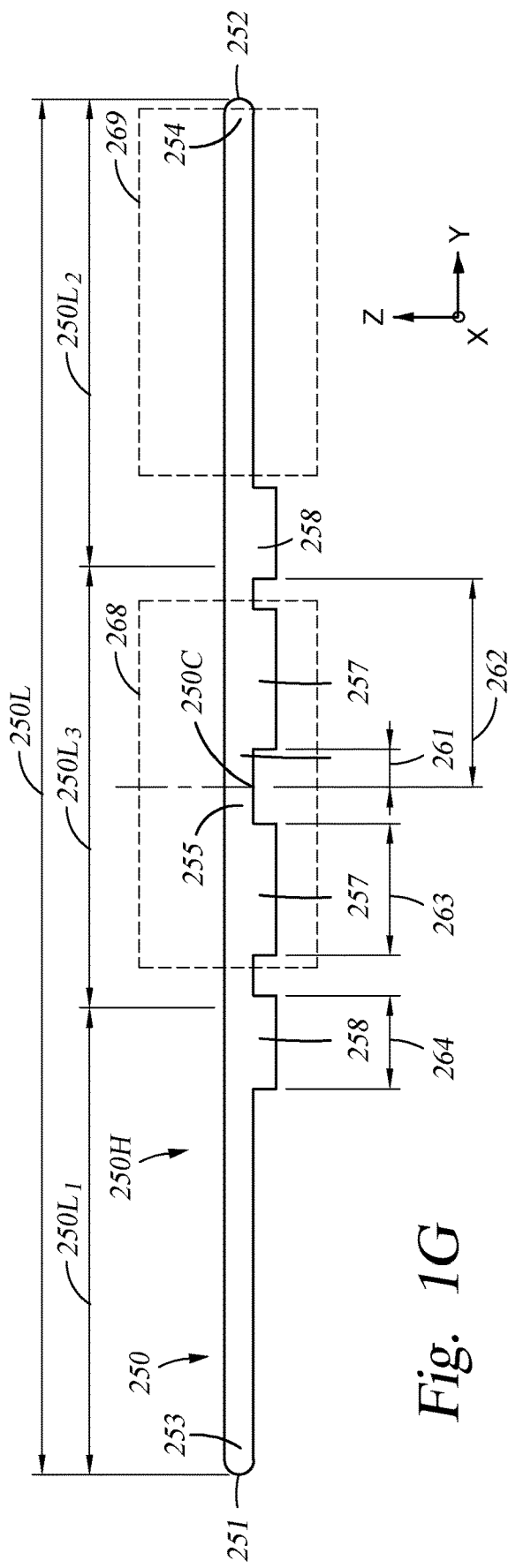
FIG. 1G is a side sectional view of a heater, according to another embodiment.

FIG. 1G is a side sectional view of a heater 250H, according to one embodiment. The heater 250H can be used, for example, in place of the second heater 220H (see FIG. 1D) in some embodiments and is referred to in the following description as the second heater 250H. The view of the heater 250H shown in FIG. 1F can correspond to the view shown in FIG. 1D of the second heater 220H. The top view (not shown) of the heater 250H can be the same as the top view of the first heater 210H shown in FIG. 1E. The heater 250H can include a heating cable 250 including a first segment 255 extending from a first curved portion 253 located at a first end 251 of the second heater 250H to a second curved portion 254 located at a second end 252 of the second heater 250H. Because the top view (not shown) of the second heater 250H can be the same as the top view of the first heater 210H shown in FIG. 1E, the second heater 250H can also include portions (not shown) corresponding to the first inner segment 216 and the second inner segment 217 shown in FIG. 1E.

The second heater 250H can be the same as the first heater 230H except that the heater 250H can include portions having larger increased thicknesses than the portions 237, 238 of the first heater 230H. For example, in the second heater 250H the first portions 237 from the first heater 230H are replaced with larger first portions 257. These larger first portions 257 extend for a first distance 263 in the Y-direction that is longer than the first length 243 that the first portions 237 extended for in the Y-direction. Furthermore, these larger first portions 257 can extend further in the Z-direction than the first portions 237. Similarly, in the second heater 250H the second portions 238 from the first heater 230H are replaced with larger second portions 258. These larger second portions 258 extend for a second distance 264 in the Y-direction that is longer than the second length 244 that the second portions 238 extended for in the Y-direction. Furthermore, these larger second portions 258 can extend further in the Z-direction than the second portions 238.

Furthermore, the portions 257, 258 are located closer a center 250C of the second heater 250H in the Y-direction than the portions 237, 238 are to the center 230O of the first heater 230H described above. For example, the first portions 257 are located a first distance 261 from the center 250C, which is less than the first distance 241 of the first portions 237 to the center 230O of the first heater 230H described above. The second portions 258 are located a second distance 262 from the center 250C, which is less than the second distance 242 of the second portions 238 to the center 230C of the first heater 230H described above.

By making the portions 257, 258 of the heater 250H larger than the respective portions 237, 238 of the first heater 230H, and by positioning the portions 257, 258 closer to the center 250C of the second heater 250H than the respective portions 237, 238 are to the center 230C of the first heater 230H, the heater 250H provides less heat to a central region surrounding the center of the second heater 250H than a central region of the same size surrounding the first heater 230H when both heaters 230H, 250H are supplied with the same power. For example, FIG. 1F shows a central region 248 surrounding both of the first portions 237 of the first heater 230H, and FIG. 1G shows a central region 268 surrounding both of the first portions 257 of the second heater 250H, where the central region 248 and the central region 268 are the same size. The larger size and closer location to the center 250C of the first portions 257 causes the second heater 250H to provide less heat to the central region 268 than the first heater 230H provides to the central region 248, which has the same size as the central region 268 when the heaters 230H, 250H are supplied with the same power.

Furthermore, there is a larger difference in heat provided between central regions relative to outer regions in the second heater 250H than there is for a difference in heat provided between central regions relative to outer regions for the first heater 230H when both heaters 230H, 250H are supplied with the same power. For example, FIG. 1F shows an outer region 249 surrounding an outer portion of the first heater 230H. The outer region 249 can be the same size as the central region 248. FIG. 1G shows an outer region 269 surrounding an outer portion of the second heater 250H. The outer region 269 can be the same size as the central region 268 in FIG. 1G and can also be the same size as the regions 248, 249 in FIG. 1F. Furthermore, the portion of the first heater 230H surrounded by the region 249 can be identical to the portion of the second heater 250H surrounded by the region 269. Because the second heater 250H includes larger first portions 257 than the first portions 237 of the first heater 230H and because the portions of the heaters 230H, 250H surrounded by the respective regions 249, 269 can be identical, the reduced heat provided to the central region 268 by the second heater 250H relative to the heat provided to the central region 248 by the first heater 230H causes the difference in heat provided to the central region 268 relative to the outer region 269 to be larger than the difference in heat provided to the central region 248 relative to the outer region 249. Thus, the second heater 250H can be described as providing a steeper heating profile in the Y-direction than the first heater 230H due to the larger changes in heat provided in the Y-direction for the second heater 250H than the changes in heat provided by the first heater 230H in the Y-direction.

Figure 1H:
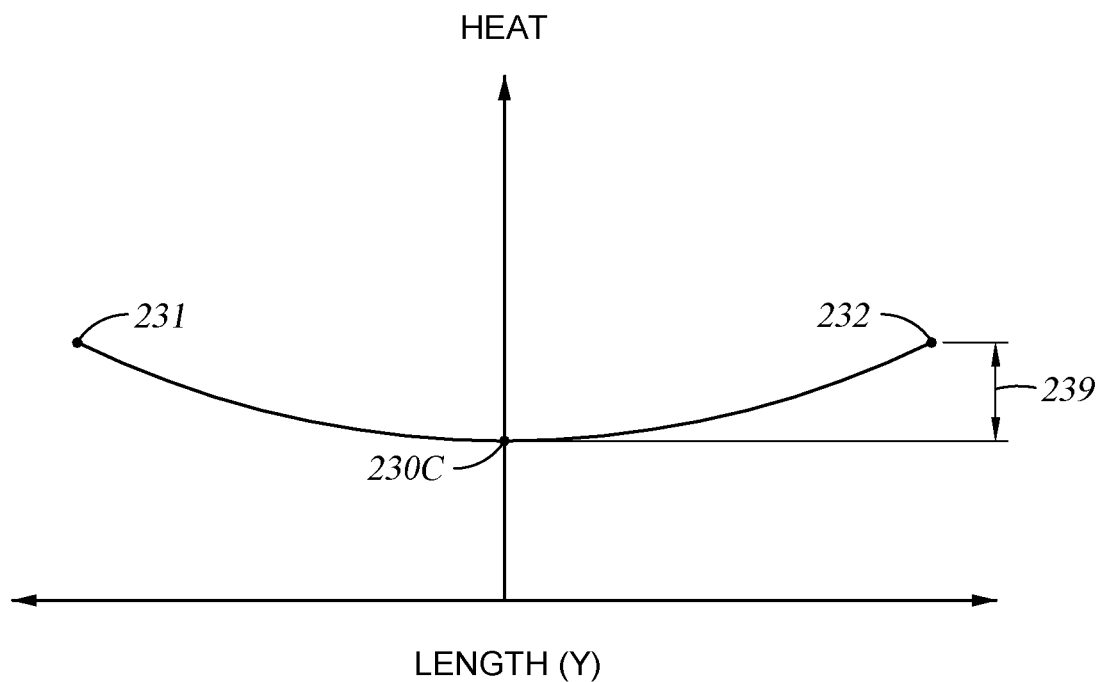
FIG. 1H shows a heat output profile for the heater shown in FIG. 1F, according to one embodiment.
Figure 1I:
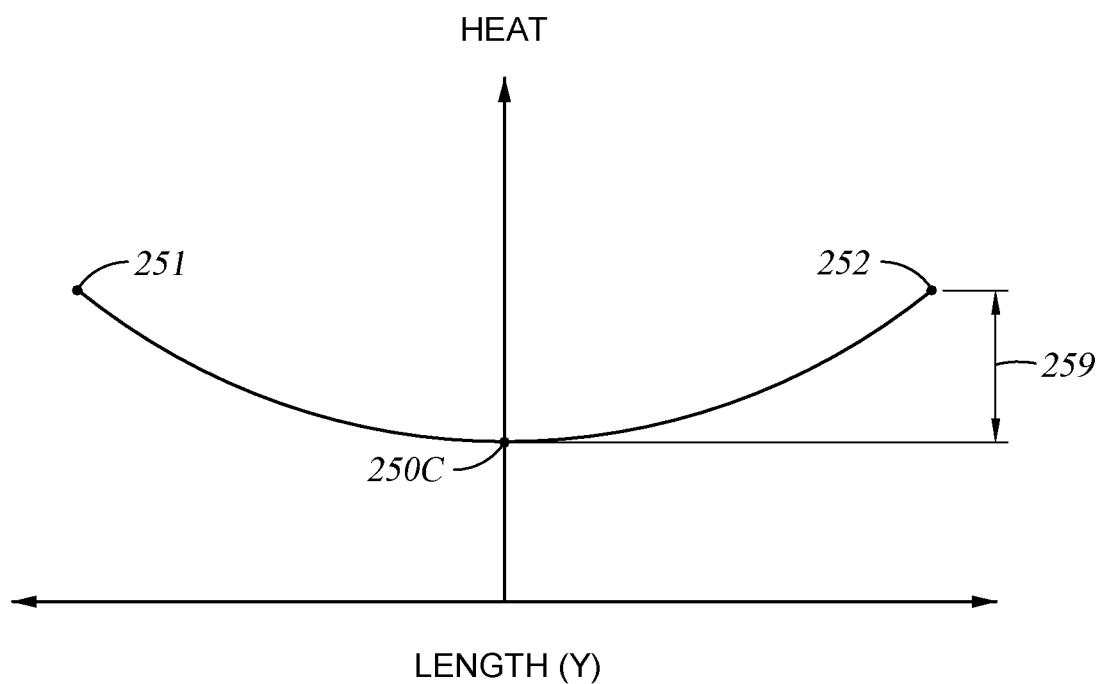
FIG. 1I shows a heat output profile for the heater shown in FIG. 1G, according to one embodiment.

For example, the difference between the heating profiles of the first heater 230H and the second heater 250H are shown in FIGS. 1H and 1I. FIG. 1H shows a heat output profile for the first heater 230H, according to one embodiment. Similarly, FIG. 1I shows a heat output profile for the second heater 250H, according to one embodiment. The first heater 230H generates more at the ends 231, 232 than at the center 230C, and the additional heat produced at the ends 231, 232 relative to the center 230C can be represented by a first difference 239. The first heater 250H generates more at the ends 251, 252 than at the center 250C, and the additional heat produced at the ends 251, 252 relative to the center 250C can be represented by a second difference 259. The second difference 259 is greater than the first difference 239, and thus the second heater 250H has a steeper heating profile than the first heater 230H.

By having two heaters 230H, 250H that each provide a varying amount of heat in the Y-direction while also having one of the heaters 250H provide a steeper heating profile, the two heaters 230H, 250H can be used together to reduce the variability of the temperature of the deposition material 75 (see FIG. 1B) and vapor of the deposition material 75 in the Y-direction. For example, if temperatures of the deposition material 75 are higher in central region $204_3$ of the interior region 204 of the crucible 201 (see FIG. 1D) than outer regions $204_1$, $204_2$ of the interior region 204 of the crucible 201, then power provided to the second heater 250H can be increased because the steeper heating profile of the second heater 250H causes increases in power to the second heater 250H to have a greater effect on heating outer regions $204_1$, $204_2$ (see FIG. 1D) of the interior region 204 of the crucible 201 than central regions $204_3$ of the interior region 204 of the crucible 201. Similarly, reducing the power provided to the first heater 230H would have a greater effect on reducing the temperature of central region $204_3$ of the interior region 204 of the crucible 201 than outer regions $204_1$, $204_2$ of the interior region 204 the crucible 201. On the other hand, if the temperatures of the deposition material 75 are higher in outer regions $204_1$, $204_2$ of the interior region 204 of the crucible 201 than central region $204_3$ of the interior region 204 of the crucible 201, then opposite actions can be taken with the power provided to the heaters 230H, 250H to reduce the variability of the temperature of the deposition material 75 in the Y-direction (e.g., reducing the power provided to the second heater 250H, or increasing the power provided to the first heater 230H).

Referring to FIGS. 1D, 1F and 1G, the varying amount of heat that the heaters 230H, 250H can provide can be explained relative to having regions that deliver varying amounts of power, such as by use of the larger sections of the heater. Because the exact positon of the portions having increased thicknesses (e.g., portions 237, 238) can be adjusted, an explanation relative to larger sections of the heaters 230H, 250H can be applicable to a wider set of the embodiments contemplated by the disclosure provided herein. The heaters 230H, 250H can each have a respective length 230L, 250L extending in the Y-direction. Each length 230L, 250L can be divided into thirds of equal length including a respective first outer section $230L_1$, $250L_1$, and a respective second outer section $230L_2$, $250L_2$, and a respective inner section $230L_3$, $250L_3$. For each heater 230H, 250H, more heat can be generated by the first outer section $230L_1$, $250L_1$ or the second outer section $230L_2$, $250L_2$ than is generated by the inner section $230L_3$, $250L_3$. Furthermore, for each heater 230H, 250H, the heat generated by the first outer section $230L_1$, $250L_1$ can be substantially equal to the heat generated by the second outer section $230L_2$, $250L_2$.

Although the heaters 230H, 250H are largely described as having two sets of portions having increased thicknesses (i.e., portions 237, 238 for the first heater 230H and portions 257, 258 for the second heater 250H) relative to the remainder of the heaters 230H, 250H, other embodiments may include more or less portions having varying power output (e.g., increased thicknesses) or have different designs for varying the amount of heat provided in the Y-direction. For example, in one embodiment the cross-sectional area of the heating cable of a heater can continuously decrease in the Y-direction from the center of the heating cable in the Y-direction. Furthermore, although the portions 237, 238 of the first heater 230H (see FIG. 1F) and the portions 257, 258 of the second heater 250H (see FIG. 1G) are described as extending from respective first segments 235, 255, which are similar to the first segment 215 shown in FIG. 1E, the heaters 230H, 250H can also include corresponding portions 237, 238, 257, 258 extending from the segments of the heaters 230H, 250H corresponding to the inner segments 216, 217 shown in FIG. 1E, so that the heaters 230H, 250H provide an amount of heat that is balanced in the X-direction.

In some embodiments, each heater 230H, 250H can be replaced by two heaters (e.g., FIG. 5 described below), so that a temperature variability of the deposition material 75 in the interior region 204 of the crucible 201 that is not symmetrical about a center in the Y-direction of the interior region 204 of the crucible 201 can be controlled. For example, referring to FIG. 1D it is possible that there may be greater heat loss on the left side of the crucible 201 (i.e., at first end wall $202_1$) than there is for on the right side of the crucible 201 (i.e., at second end wall $202_1$). Thus, the heaters 230H, 250H (see FIG. 1F, 1G) having the open loop design (see FIG. 1E) could each be replaced by, for example, two heaters having an open loop design that does not extend as far in the Y-direction, so that the two heaters may be placed side-by-side in the X-Y plane at the locations in the Z-direction for each of the heaters 210H, 220H shown in FIG. 1B.

Figure 2A:
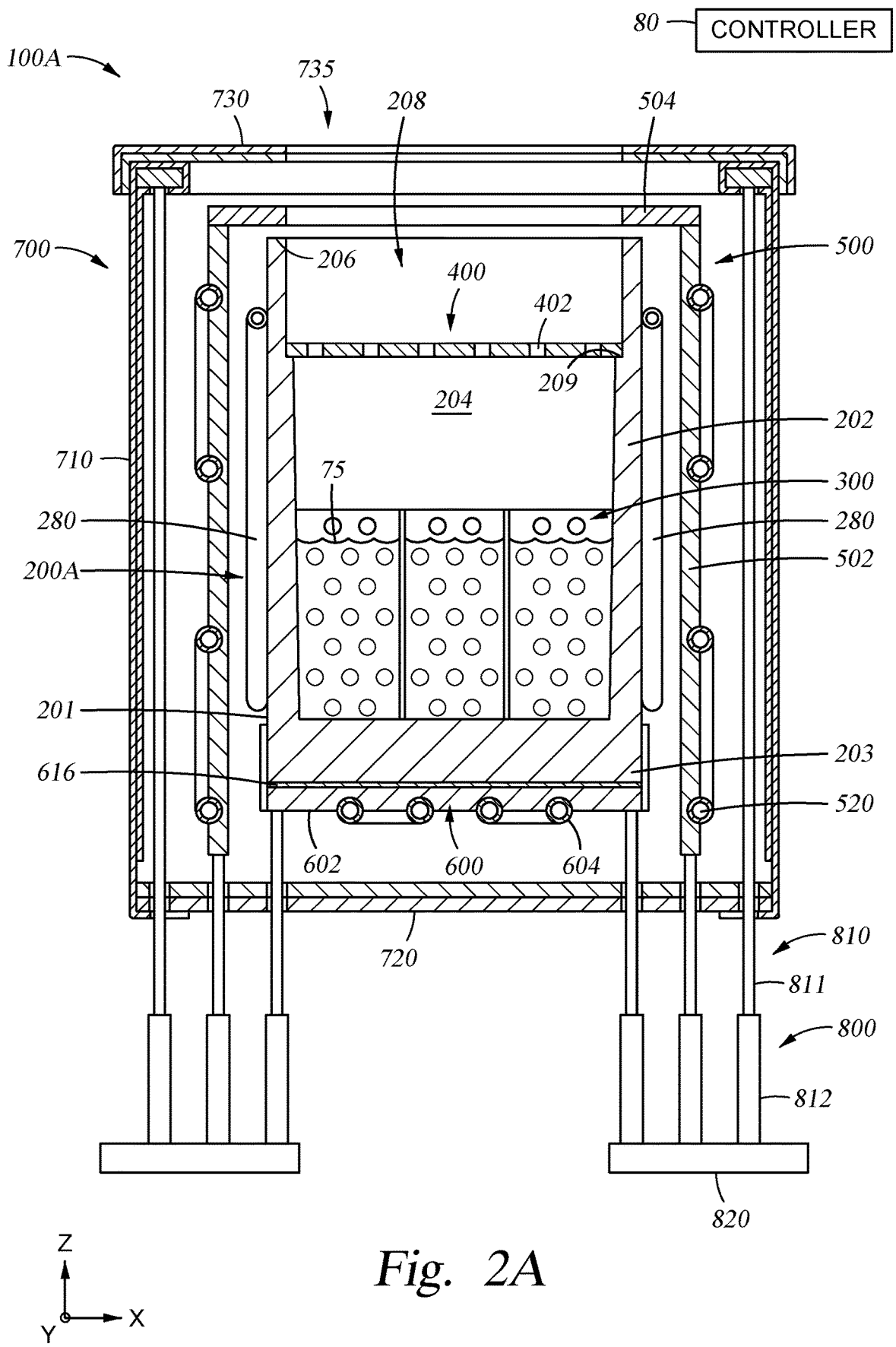
FIG. 2A is a side cross-sectional view of an evaporation source, according to another embodiment.

FIG. 2A is a side cross-sectional view of an evaporation source 100A, according to one embodiment. The evaporation source 100A is similar to the evaporation source 100 described above (see FIG. 1B) except that the evaporation source 100A includes a crucible assembly 200A that is different from the crucible assembly 200 described above, and the evaporation source 100A also does not include the second heater 220H described above. The crucible assembly 200A includes a heater 280 disposed around the walls 202 of the crucible 201. The heater 280 can include a heating cable, such as a sheathed heating cable. The heating cable can be distributed across each of the walls 202 in a pattern using a plurality of loops. A portion of two of these loops is visible in FIG. 2A. The loops allow thermal expansion of the heating cable of the heater 280 with respect to the crucible 201. Electric power may be applied to the heating cable of the heater 280 to provide the heat to the crucible 201 by a power supply that is coupled to a temperature control system. By using the heater 282 direct heat through the crucible walls 202, the variability in the temperature of the deposition material 75 in the X-direction and the Y-direction can be reduced. This is because the additional heat losses that occur around the perimeter of the crucible 201 can be substantially negated by providing the heat through the perimeter of the crucible 201. In another embodiment, the heater 280 may be placed in the crucible walls 202 to place the heater 280 closer to the material being heated. In yet another embodiment, the heater 280 may surround the crucible 201, a heater similar to the heater 280 may be placed below the crucible 201, and an additional heater, such as the heater 220H (See FIG. 1B) or heater 250H (FIG. 1G) may disposed in the interior region 204 of the crucible 201 above the thermal distributor 300.

Figure 2B:
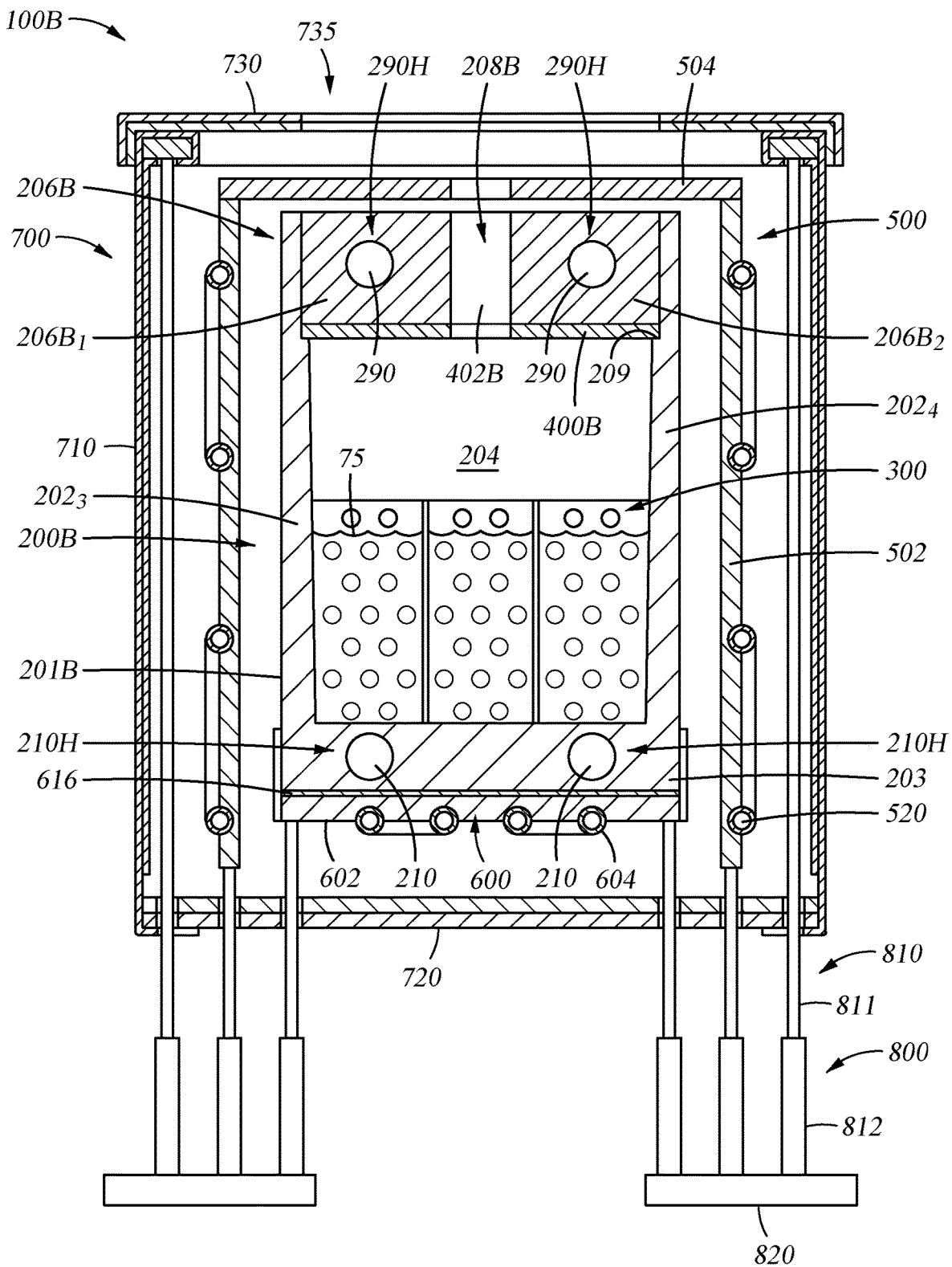
FIG. 2B is a side cross-sectional view of an evaporation source, according to another embodiment.

FIG. 2B is a side cross-sectional view of an evaporation source 100B, according to one embodiment. The evaporation source 100B is similar to the evaporation source 100 described above (see FIG. 1B) except that the evaporation source 100B includes a crucible assembly 200B that is different from the crucible assembly 200 described above, the evaporation source 100B also does not include the second heater 220H described above, and the evaporation source 100 B includes a lid assembly 400B that is different from the lid assembly 400 described above. The lid assembly 400B includes openings 402B disposed in a central location in the X-direction. The openings 402B can be wider in the X-direction than the openings 402 (see FIG. 1B) described above. The openings 402B can be distributed in the Y-direction using a pattern similar to the distribution of the openings 402 shown in FIG. 1D. For example, the openings 402B can be narrower at the center in the Y-direction of the lid assembly 400B than openings 402B at outer regions of the lid assembly 400B, and the openings 402B can be spaced further apart at the center of the lid assembly 400B in the Y-direction than openings 402B at outer regions of the lid assembly 400B.

The crucible assembly 200B includes a crucible 201B that is different from the crucible 201 described above. The crucible 201B includes a top 206B extending over the interior region 204 of the crucible 201B. The top 206B includes a first portion $206B_1$ extending from the first side wall $202_3$ and a second portion $206B_2$ extending from the second side wall $202_4$. The crucible assembly 200B can further include a heater 290H including a corresponding cable 290 disposed in the top 206B of the crucible 201B. Although the crucible assembly 200B is shown including two heaters 210H, 290H, in some embodiments only one heater may be included. A top view of the heater 290H can have the same shape as the top view of the first heater 210H shown in FIG. 1E. The top 206B can also include portions (not shown) extending in from the walls $202_1$, $202_2$ to house the curved portions of the heater 290H, which can have a similar shape to the curved portions 213, 214 of the first heater 210H. By disposing the heater 290H in the top 206B of the crucible 201B, temperature variations in the interior of the crucible 201B above the thermal distributor 300 can be reduced. For example, the high thermal mass of the top 206B of the crucible 201B can prevent small changes in the power provided to the heater 290H from causing large changes to the temperature of the vapor of the deposition material 75 because the high thermal mass of the top 206B allows the heat released into the interior region 204 by the top 206B to respond slowly to changes in heat provided to the top 206B. The heaters 210H, 290H can also be replaced with the heaters 230H, 250H described above in reference to FIGS. 1F, 1G, so that temperature variations in the Y-direction can be reduced as described above. Furthermore, in some embodiments, either the first heater 210H or the heater 290H may be omitted.

Figure 3:
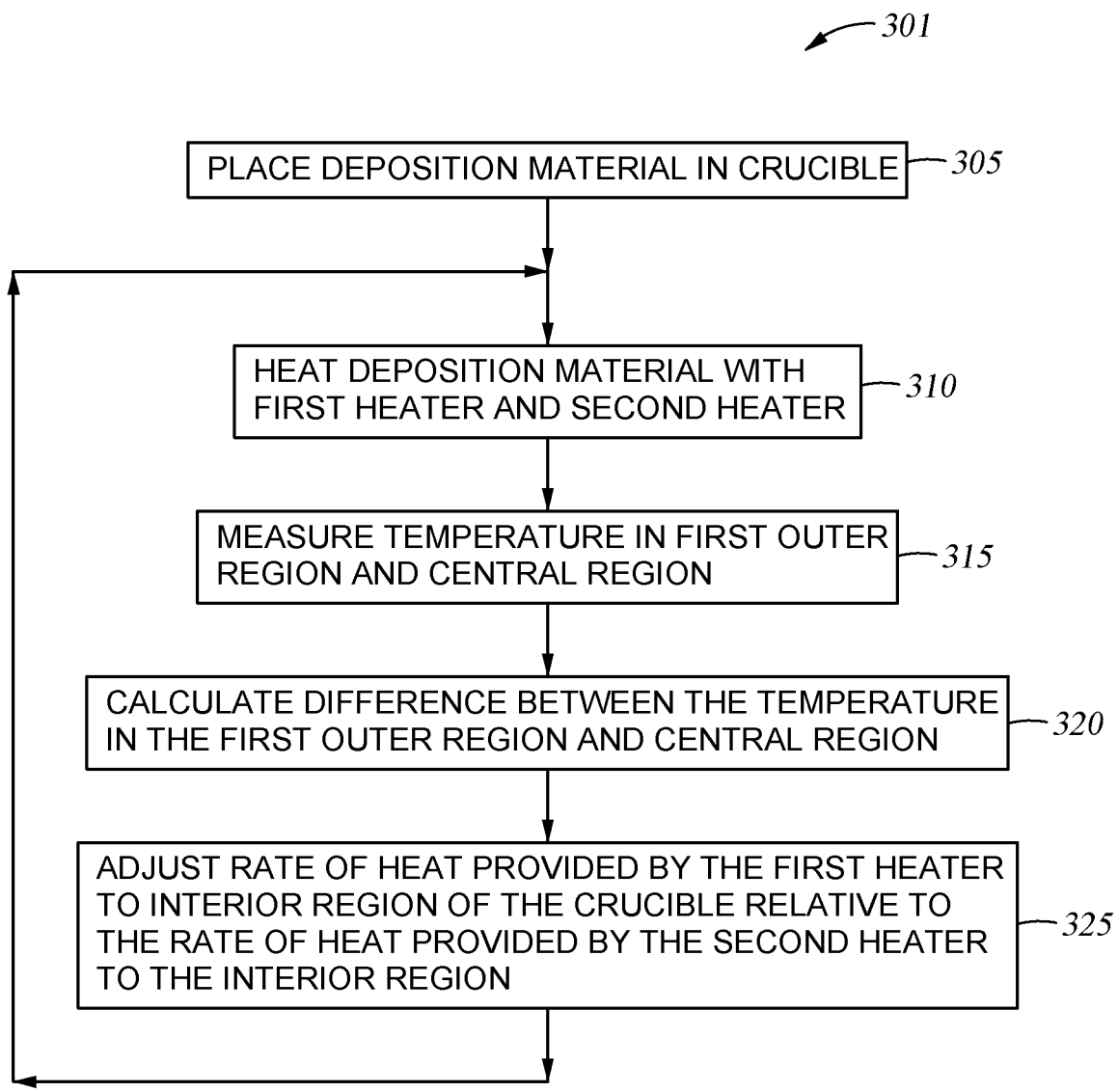
FIG. 3 is a process flow diagram of a method for depositing a source material on a substrate, according to one embodiment.

FIG. 3 is a process flow diagram of a method 301 for depositing a source material on a substrate, according to one embodiment. Referring to FIGS. 1B, 1D, 1F, and 1G, the method 301 is described. The method 301 can be performed using the evaporation source 100 to deposit vapor of the deposition material 75 (see FIG. 1B) on the substrate 50 (see FIG. 1D). The heaters 230H, 250H are used in place of the heaters 210H, 220H in the evaporation source 100.

At block 305, deposition material 75 is placed in the interior region 204 of the crucible 201. At block 310, the heaters 230H, 250H heat the deposition material 75. As described above, in order to reduce the variability of the temperature of the deposition material 75 in the Y-direction, the heaters 230H, 250H provide heat at a higher rate to the first outer region $204_1$ (see FIG. 1D) than to the central region $204_3$ as well as heat at a higher rate to the second outer region $204_2$ than to the central region $204_3$.

Furthermore, the second heater 250H provides a greater proportion of its heat to the outer regions $204_1$, $204_2$ than the proportion the first heater 230H provides to the outer regions $204_1$, $204_2$. For example, if (1) the heat transfer rate provided by the first heater 230H to the first outer region $204_1$ relative to the heat transfer rate provided by the first heater 230H to the central region $204_3$ can be expressed as a first ratio, and (2) the heat transfer rate provided by the second heater 250H to the first outer region $204_1$ relative to the heat transfer rate provided by the second heater 250H to the central region $204_3$ can be expressed as a second ratio, then the second ratio is greater than the first ratio.

At block 315, a first temperature is measured in the first outer region $204_1$ using the temperature sensor 271 (FIG. 1D) and a second temperature is measured in the central region $204_3$ using the temperature sensor 273 (FIG. 1D). In some embodiments, a third temperature can also be measured in the second outer region $204_2$. At block 320, a difference between the first temperature and the second temperature can be calculated, for example by the controller 80 (FIG. 1D).

At block 325, a rate of heat provided by the first heater 230H to the interior region 204 relative to a rate of heat provided by the second heater 250H to the interior region 204 is adjusted, for example by the controller 80, based on the difference between the first temperature and the second temperature. Although the following describes adjusting the rates of heat based on temperature measurements, in some embodiments the rates of heat may be adjusted based on measurements of evaporation rates or measurements of thicknesses on different portions of the substrate 50. For example, if the second temperature is greater than the first temperature, then (1) the rate of heat provided by the second heater 250H to the interior region 204 can be increased relative to the rate of heat provided by the first heater 230H to the interior region 204, or (2) the rate of heat provided by the first heater 230H to the interior region 204 can be decreased relative to the rate of heat provided by the second heater 250H to the interior region 204. In one embodiment, the controller 80 (FIG. 1D) can calculate a difference between a temperature setpoint for the interior region 204 and an average of the first temperature and the second temperature to determine whether to increase the rate of heat provided by the second heater 250H or to decrease the rate of heat provided by the first heater 230H when the second temperature is greater than the first temperature. For example, if second temperature is greater than the first temperature, the temperature setpoint is 900° C., and the average of the first temperature and the second temperature is 899.5° C., then the controller 80 can adjust an output from the controller to increase the rate of heat provided, by the second heater 250H, so that the overall temperature of the interior region 204 increases and the difference between the first temperature and the second temperature is reduced. After adjusting the rate of heat provided by the heaters 230H, 250H at block 325, the method 301 can continue cycling through blocks 310 through 325 to maintain a low level of variability of the temperature in the interior region 204 in the Y-direction.

Figure 4:
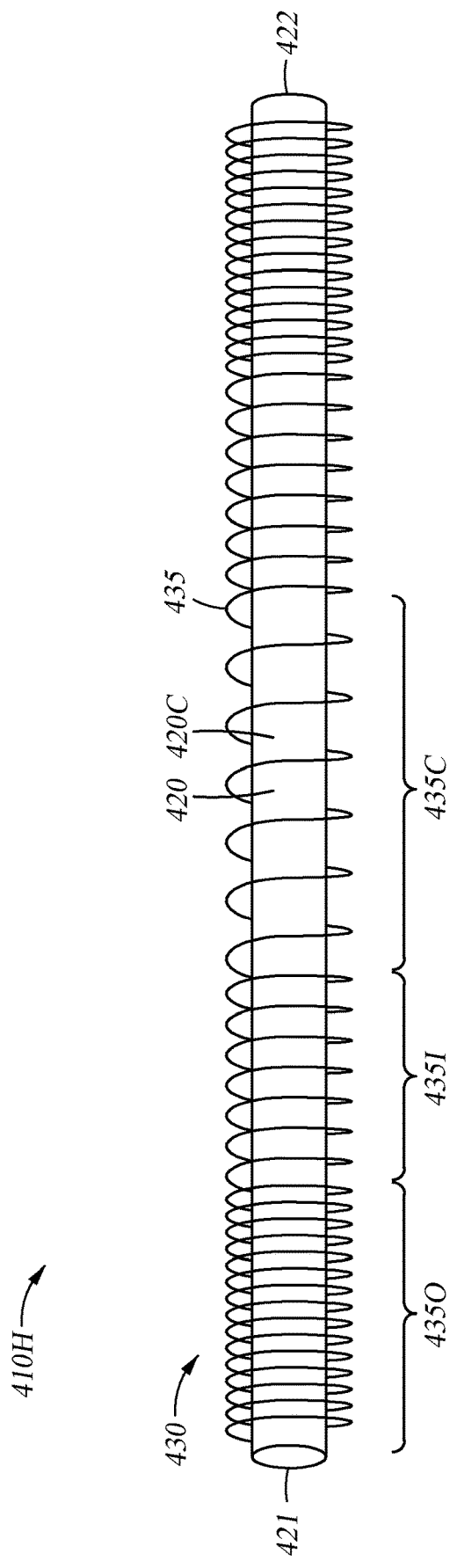
FIG. 4 is a side view of a heater, according to another embodiment.

FIG. 4 is a side view of a heater 410H, according to one embodiment. The heater 410H can be used, for example, in place of one or more of the heaters 210H, 220H, and 290H described above. In some embodiments, the heater 410H can have a shape of the heater 210H as shown in FIG. 1E. The heater 410H includes a core 420. The core extends from a first end 421 to a second end 422. The core further includes a center 420C. In some embodiments, the core 420 may be formed of a heat resistant electrically insulating material (e.g., a ceramic material or in some embodiments a graphitic material with an insulating and heat resistant coating). The heater 410H may further include a heating cable 430, which can be wrapped around the core 420. For example, in some embodiments, the heating cable 430 can be wrapped around the core 420 in a helical pattern to form a series of rings 435 extending substantially from the first end 421 to the second 422 of the core 420. The heating cable 430 can be disposed within slots or cavities formed within a surface of the core 420 in a helical pattern that extends along the length of the core 420.

The spacing between the rings 435 can vary from the first end 421 to the center 420C and from the center 420C to the second end 422. For example, the rings 435 can include an outer section 435O at the first end 421, a central section 435C at the center 420C, and an intermediate section 435I located between the outer section 435O and the central section 435C. The cable can also include corresponding intermediate and outer sections on the right side of the center 420C. The rings 435 in the central section 435C can be spaced apart further from each other than the rings 435 in the intermediate section 435I are spaced apart from each other, and the rings 435 in the intermediate section 435I can be spaced apart further from each other than the rings 435 in the outer section 435O are spaced apart from each other. Sections of the heater 410H having closely packed rings 435 can produce more heat than sections of the heater 410H having loosely packed rings 435. Thus, the outer region 435O having the most closely packed rings 435 can produce more heat along a given length in the Y-direction than the heat produced by the intermediate section 435I or the central region 435C along the same length in the Y-direction. Furthermore, the central region 435C having the most loosely packed rings 435 produces less heat than the heat produced by the intermediate region 435I or the outer region 435O. The spacing between the rings 435 can be varied as needed along the length of the core 420 to produce the desired heating profile in the Y-direction. Furthermore, in embodiments including two or more heaters (e.g., the evaporation source 100 of FIG. 1B) the spacing between the rings 435 in the different heaters can vary according to different profiles in the Y-direction, so that the two heaters can be used together to independently reduce the variability of the temperature of the deposition material 75 (see FIG. 1B) in the Y-direction and the temperature of the vapor of the deposition material 75 in the Y-direction.

Figure 5:
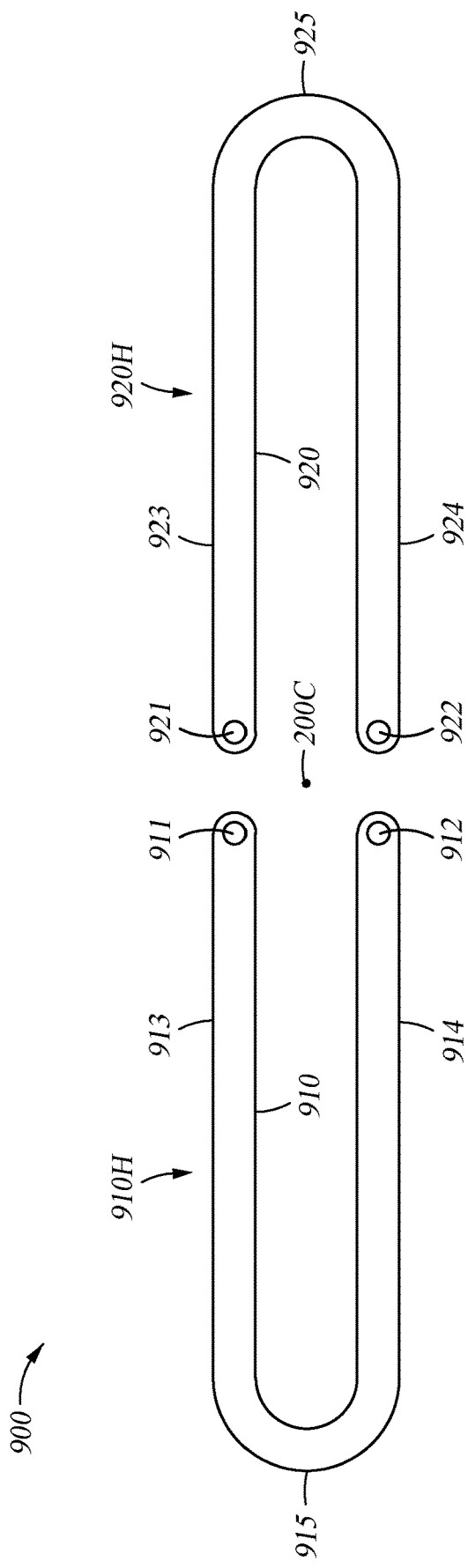
FIG. 5 is a top view of a heating system, according to another embodiment.

FIG. 5 is a top view of a heating system 900, according to one embodiment. The heating system 900 can be used, for example, in place of one or more of the heaters 210H, 220H, 290H, and 410H described above. The heating system 900 includes a first heater 910H and a second heater 920H. The first heater 910H and the second heater 920H can be spaced apart from each other in the Y-direction to enable independent heating of areas of the evaporation source (e.g., evaporation source 100 described above) that are spaced apart in the Y-direction. For example, in some embodiments the heaters 910H, 920H can be symmetrically positioned around a center 200C of the crucible assembly (e.g., crucible assembly 200 described above). Independent heating of different portions of the crucible assembly spaced apart in the Y-direction can be useful when the heat loss at opposing ends of the crucible assembly differ from each other.

The first heater 910H includes a first heating cable 910 having a first leg 911 and a second leg 912. The first leg 911 extends from a first inner end 913 to a curved portion 915. The second leg 912 extends from a second inner end 914 to the curved portion 915. The curved portion 915 connects the first leg 911 to the second leg 912. The curved portion 915 can be disposed in the Y-direction in a corresponding position to the curved portion 213 described above in reference to the heater 210H of FIG. 1E.

The second heater 920H includes a second heating cable 920 having a first leg 921 and a second leg 922. The first leg 921 extends from a first inner end 923 to a curved portion 925. The second leg 922 extends from a second inner end 924 to the curved portion 925. The curved portion 925 connects the first leg 921 to the second leg 922. The curved portion 925 can be disposed in the Y-direction in a corresponding position to the curved portion 214 described above in reference to the heater 210H of FIG. 1E.

While the foregoing is directed to embodiments of the present disclosure, other and further embodiments of the disclosure may be devised without departing from the basic scope thereof, and the scope thereof is determined by the claims that follow.

What is claimed is:

1. An evaporation source for depositing a source material on a substrate, the evaporation source comprising:
   a crucible comprising:
      a base;
      a plurality of walls surrounding an interior region of the crucible, the plurality of walls including a first end wall spaced apart from a second end wall in a first direction; and
   a lid disposed over the interior region; the lid comprising a first outer section including a first plurality of openings, a second outer section including a second plurality of openings, and an inner section including a third plurality of openings, wherein
      the first outer section is spaced apart from the second outer section in the first direction,
      the inner section is disposed between the first outer section and the second outer section, and
      the openings in the third plurality of openings are spaced farther apart from each other than the openings in the first plurality of openings are from each other;
   a thermal isolation assembly disposed around the crucible, the thermal isolation assembly comprising:
      one or more vertical walls; and
      one or more cooling tubes disposed adjacent to the one or more vertical walls, the one or more cooling tubes having an opening that is configured to receive a cooling fluid;
   a first plurality of legs that extend between the thermal isolation assembly and a supporting surface, and are configured to support the thermal isolation assembly; and
   a second plurality of legs that extend between the base of the crucible and the supporting surface, and are configured to support and vertically position the crucible relative to the substrate.

2. The evaporation source of claim 1, wherein the inner section is centered in the crucible in the first direction.

3. The evaporation source of claim 1, wherein the openings in the third plurality of openings are spaced further apart from each other than the openings in the second plurality of openings are from each other.

4. The evaporation source of claim 1, wherein the openings in the first plurality of openings and the second plurality of openings have a width that is greater than a width of the openings in the third plurality of openings.

5. An evaporation source for depositing a source material on a substrate, the evaporation source comprising:
   a crucible comprising:
      a base;
      a plurality of walls surrounding an interior region of the crucible, the plurality of walls including a first end wall spaced apart from a second end wall in a first direction, wherein
         the interior region includes a first outer region, a second outer region and a central region,
         the central region disposed between the first outer region and the second outer region, and
         each of the first outer region, the second outer region, and the central region has a same width in the first direction; and a first heater disposed in the base, the first heater configured to provide heat at a higher rate to the first outer region than to the central region;
   a thermal isolation assembly disposed around the crucible;
   a first plurality of legs coupled to the base of the crucible, wherein the first plurality of legs are configured to support the crucible and position the base a distance from a supporting surface; and
   a second plurality of legs coupled to the thermal isolation assembly, wherein the second plurality of legs are configured to support and position the thermal isolation assembly a distance from the supporting surface.

6. The evaporation source of claim 5, further comprising a second heater disposed above the base, the second heater configured to provide heat at a higher rate to the first outer region than to the central region.

7. The evaporation source of claim 6, wherein
   a first ratio defines the rate at which the first heater is configured to heat the first outer region relative to the rate at which the first heater is configured to heat the central region;
   a second ratio defines the rate at which the second heater is configured to heat the first outer region relative to the rate at which the second heater is configured to heat the central region; and
   the second ratio is higher than the first ratio.

8. The evaporation source of claim 6, further comprising a lid disposed over the base, wherein the second heater is disposed between the base of the crucible and the lid.

9. The evaporation source of claim 6, wherein the second heater is disposed in a top of the crucible.

10. The evaporation source of claim 6, wherein the second heater is formed of a first cable having a thickness that varies in the first direction.

11. The evaporation source of claim 6, further comprising a lid disposed over the interior region, the lid comprising a first outer section including a first plurality of openings, a second outer section including a second plurality of openings, and an inner section including a third plurality of openings, wherein
   the first outer section is spaced apart from the second outer section in the first direction;
   the inner section is disposed between the first outer section and the second outer section; and
   the openings in the third plurality of openings are spaced farther apart from each other than the openings in the first plurality of openings are from each other.

12. The evaporation source of claim 11, wherein the openings in the third plurality of openings are spaced further apart from each other than the openings in the second plurality of openings are from each other.

13. The evaporation source of claim 5, wherein the first heater is formed of a first cable having a thickness that varies in the first direction.

14. A method of depositing a source material on a substrate, the method comprising:
   placing deposition material in an interior region of an evaporation source, the evaporation source comprising:
      a crucible; the crucible comprising:
         a base;

a plurality of walls surrounding the interior region of the crucible, the plurality of walls including a first end wall spaced apart from a second end wall in a first direction, wherein
the interior region includes a first outer region, a second outer region and a central region,
the central region disposed between the first outer region and the second outer region, and
each of the first outer region, the second outer region, and the central region has a same width in the first direction;
a thermal isolation assembly disposed around the crucible, the thermal isolation assembly comprising:
one or more vertical walls; and
one or more cooling tubes disposed adjacent to the one or more vertical walls;
a first plurality of legs coupled to the base of the crucible; and
a second plurality of legs coupled to the thermal isolation assembly; and
heating the deposition material by providing more heat to the first outer region than to the central region; and
distributing a cooling fluid through the cooling tubes.

15. The method of claim 14, wherein heating the deposition material comprises:
heating the deposition material with a first heater disposed below the interior region, wherein
the first heater is configured to provide heat at a higher rate to the first outer region than to the central region; and
a rate of heat provided by the first heater to the first outer region relative a rate of heat provided by the first heater to the central region is a first ratio.

16. The method of claim 15, wherein heating the deposition material comprises:
heating the deposition material with a second heater disposed above the deposition material, wherein
the second heater is configured to provide heat at a higher rate to the first outer region than to the central region; and
a rate of heat provided by the second heater to the first outer region relative a rate of heat provided by the second heater to the central region is a second ratio.

17. The method of claim 16, wherein the second ratio is different than the first ratio.

18. The method of claim 17, further comprising
measuring a first temperature in the first outer region;
measuring a second temperature in the central region;
calculating a difference between the first temperature and the second temperature; and
adjusting a rate of heat provided by the first heater to the interior region relative to a rate of heat provided by the second heater to the interior region based on the difference between the first temperature and the second temperature.

19. The method of claim 16, wherein the second ratio is greater than the first ratio.

20. The method of claim 19, further comprising
measuring a first temperature in the first outer region;
measuring a second temperature in the central region, wherein the second temperature is greater than the first temperature,
calculating a difference between the first temperature and the second temperature; and
increasing a rate of heat provided by the second heater to the interior region relative to a rate of heat provided by the first heater to the interior region based on the difference between the first temperature and the second temperature.

* * * * *